United States Patent
Ramirez et al.

(10) Patent No.: US 10,659,258 B1
(45) Date of Patent: May 19, 2020

(54) MATCHING TRANSMITTER IMPEDANCE TO RECEIVER TERMINATION USING AN AVERAGE OF TRANSMITTER OUTPUT VOLTAGE SAMPLES

(71) Applicant: International Business Machines Corporation, Armonk, NY (US)

(72) Inventors: Daniel Ramirez, Rochester, MN (US); Eric J Lukes, Stewartville, MN (US); Henry M Newshutz, Rochester, MN (US); George F Paulik, Rochester, MN (US); Raymond A Richetta, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/195,385

(22) Filed: Nov. 19, 2018

(51) Int. Cl.
| | | |
|---|---|---|
| *H03H 7/30* | (2006.01) | |
| *H04L 25/02* | (2006.01) | |
| *H04L 25/03* | (2006.01) | |
| *H03H 11/28* | (2006.01) | |

(52) U.S. Cl.
CPC ......... *H04L 25/0278* (2013.01); *H03H 11/28* (2013.01); *H04L 25/0272* (2013.01); *H04L 25/03343* (2013.01)

(58) Field of Classification Search
CPC .......... H04L 25/0278; H04L 25/03343; H04L 25/0272; H03H 11/28
See application file for complete search history.

(56) References Cited

U.S. PATENT DOCUMENTS

| | | | |
|---|---|---|---|
| 9,041,569 B2 | 5/2015 | Zhou et al. | |
| 9,397,679 B1 | 7/2016 | Harpe | |
| 9,831,887 B2 | 11/2017 | Wen et al. | |
| 9,836,428 B2 | 12/2017 | Oh et al. | |
| 9,843,324 B1 | 12/2017 | Hafizi et al. | |
| 9,941,795 B1* | 4/2018 | Mayega | G01R 19/003 |
| 2009/0190648 A1* | 7/2009 | Sakano | G09G 5/003 375/232 |
| 2016/0231766 A1 | 8/2016 | Wu et al. | |
| 2018/0114586 A1 | 4/2018 | Jang et al. | |

OTHER PUBLICATIONS

Chen Shaui, A low-power high-swing voltage-mode transmitter, 2012 J. Semicond. 33 045003, pp. 045003-1 to 045003-6.
Maximilian Thürmer, Modelling and performance analysis of multigigabit serial interconnects using real number based analog verification methods, Dissertation submitted to the Combined Faculty for the Natural Sciences and Mathematics of Heidelberg University, Germany for the degree of Doctor of Natural Sciences, 2018.
Chiem, Edwin Yuel-Wai, Multi-Gigahertz Synchronous Sampling and Triggering (SST) Circuit with Picosecond Timing Resolution, UC Irvine Electronic Theses and Dissertations, Publication Date Jan. 1, 2017.

(Continued)

*Primary Examiner* — Dhaval V Patel
(74) *Attorney, Agent, or Firm* — Robert R. Williams

(57) ABSTRACT

A method and apparatus to adjust a differential transmitter output impedance is disclosed. Output voltage is sampled and averaged to mitigate noise and leakage. Averaged uplevel and downlevel voltages are used to select a number of pullup devices and a number of pulldown devices to control the differential transmitter output impedance to match a distal termination resistance or a transmission line impedance.

18 Claims, 17 Drawing Sheets

(56) References Cited

OTHER PUBLICATIONS

Samantha M. McDonnell, Compensation and Calibration Techniques for High Performance Current-Steering, Presented in Partial Fulfillment of the Requirements for the Degree Doctor of Philosophy in the Graduate School of the Ohio State University, The Ohio State University 2016.

Seung-Jun Bae, A 3Gb/s 8b Single-Ended Transceiver for 4-Drop DRAM Interface with Digital Calibration of Equalization Skew and Offset Coefficients, ISSCC 2005 / Session 28 / Clocking and I/O / 28.6.

Jri Lee, A 20Gb/s Broadband Transmitter with Auto-Configuration Technique, ISSCC 2007 / Session 24 / Multi-GB/s Transceivers / 24.5.

Jun-Hyun Bae, A 1V 2.8Gbps 0.18m CMOS Inverter-Based Digital Differential Transmitter with Calibrations of Termination and Mismatch, 978-1-4244-2599-0/08/$25.00 © 2008 IEEE I-346 2008 International SoC Design Conference.

Kambiz Kaviani, A 0.4mW/Gb/s 16Gb/s Near-Ground Receiver Front-End with Replica Transconductance Termination Calibration, ISSCC 2012 / Session 7 / Multi-Gb/s Receiver & Parallel I/O Techniques / 7.2.

Vazgen Melikyan, Receiver/Transmitter Input/Output Termination Resistance Calibration Method, 2013 IEEE XXXII International Scientific Conference Electronics and Nanotechnology (ELNANO), 978-1-4673-4672-6/13/$31.00 © 2013 IEEE.

Young-Chul Cho, A Sub-1.0V 20nm 5Gb/s/pin Post-LPDDR3 I/O interface with Low Voltage-Swing Terminated Logic and Adaptive Calibration Scheme for Mobile Application, 2013 Symposium on VLSI Circuits Jun. 12-14, 2013.

Melikyan Vazgen SH, Self-calibration Method for Input/Output Termination Resistance Variation Elimination, 2014 IEEE XXXIV International Scientific Conference Electronics and Nanotechnology (ELNANO), 978-1-4799-4580-1/14/ $31.00 © 2014 IEEE.

Vazgen Melikyan, Resistance Calibration Method Without External Precision Elements, 978-1-4799-7630-0/14/ $31.00 © 2014 IEEE.

Kang-Sub Kwak, A Low-Power Two-Tap Voltage-Mode Transmitter With Precisely Matched Output Impedance Using an Embedded Calibration Circuit, IEEE Transactions on Circuits and Systems—II: Express Briefs, vol. 63, No. 6, June 2016.

Yongsuk Choi, A Novel On-Chip Impedance Calibration Method for LPDDR4 Interface between DRAM and AP/SoC, 2016 International Great Lakes Symposium on VLSI (GLSVLSI) May 18-20, 2016.

\* cited by examiner

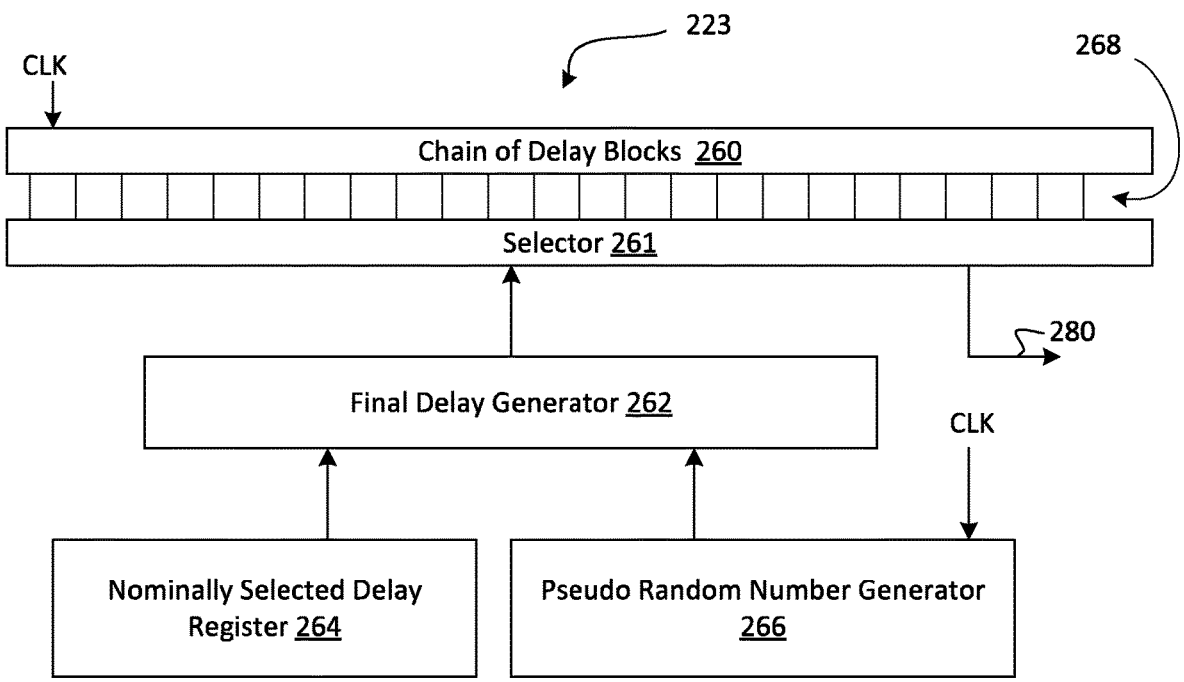
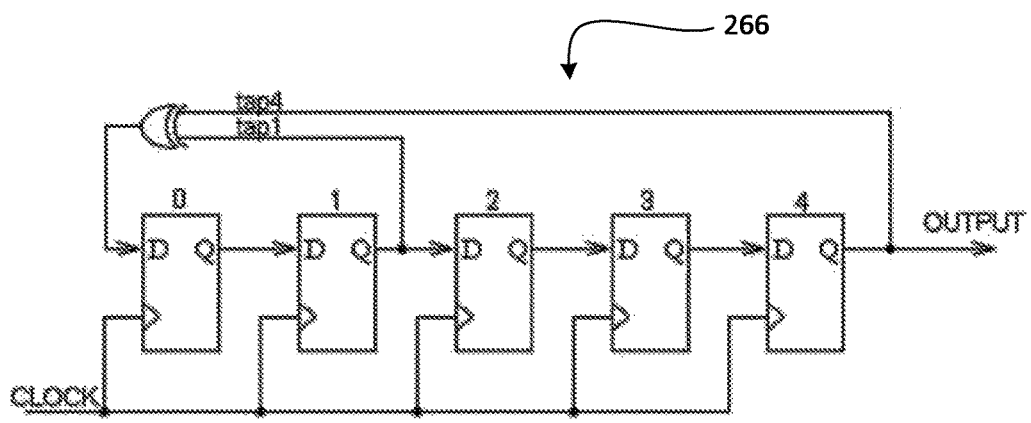
Fig. 2C

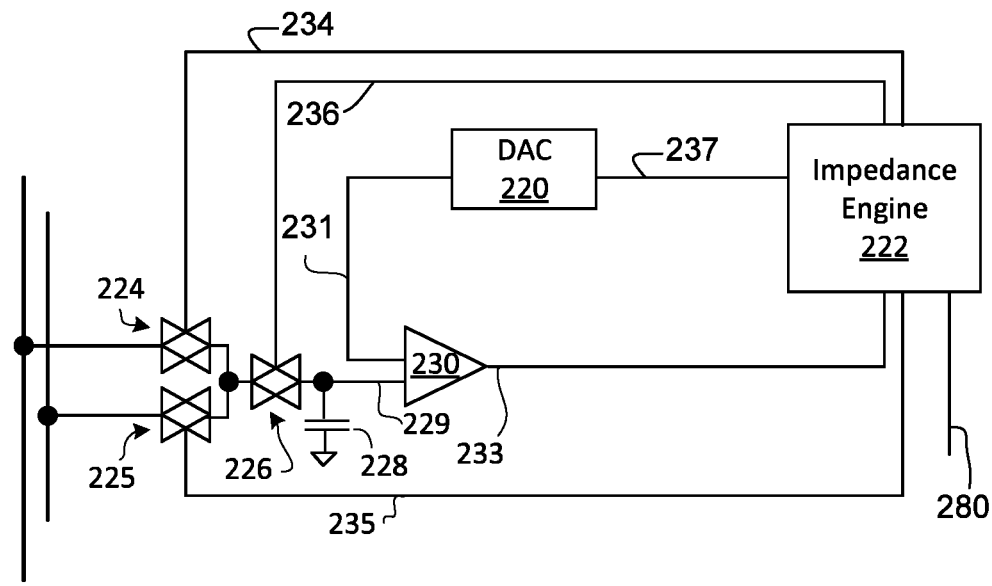
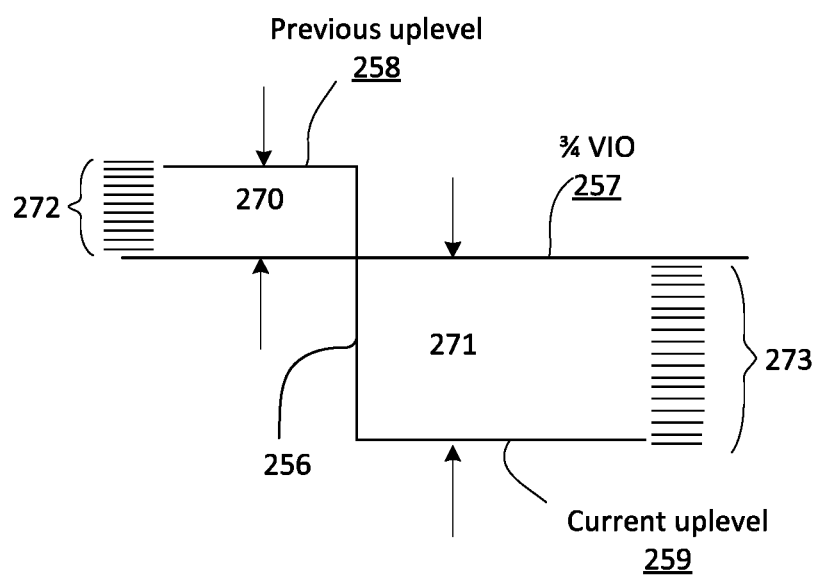
Fig. 2D

Best Setting: Uplevel and Downlevel Method

Best Setting: Supply Voltage
Method

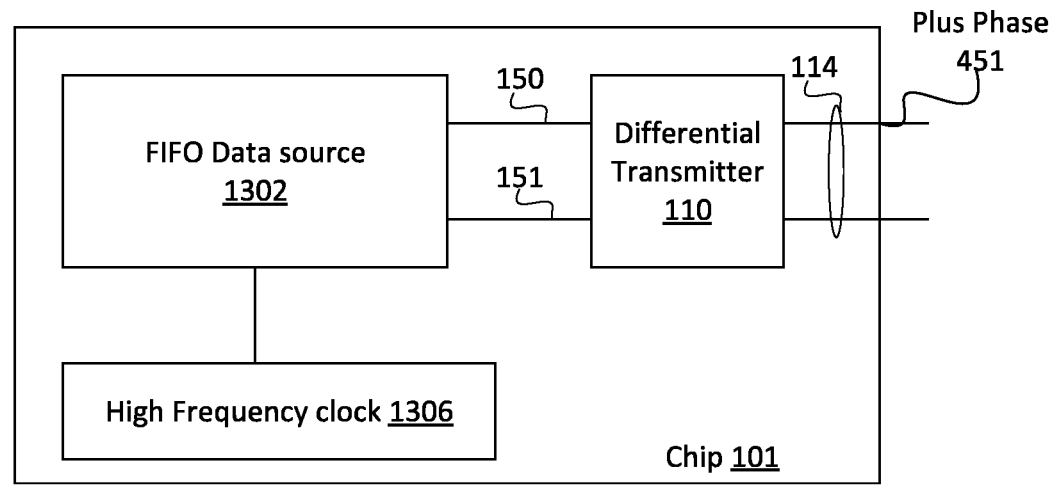
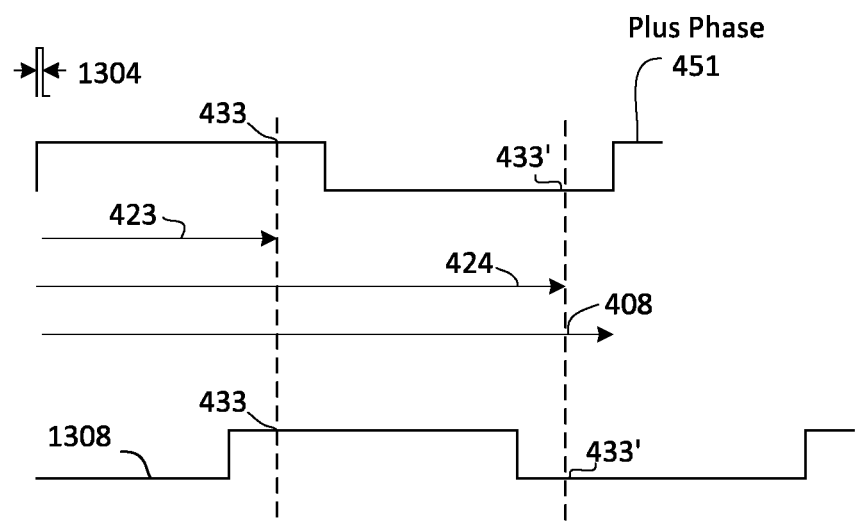
Fig. 12

MATCHING TRANSMITTER IMPEDANCE TO RECEIVER TERMINATION USING AN AVERAGE OF TRANSMITTER OUTPUT VOLTAGE SAMPLES

BACKGROUND

Embodiments presented in this disclosure relate to high-speed differential signaling. Methods and apparatus are described to closely match a driver impedance to a receiver terminator. In very high-speed signaling, proper transmitter impedance matching is critical to signal integrity. Noise on a transmitter chip and leakage in capacitances and FETs (Field Effect Transistors) have become problematic in determining proper driver impedance in high-speed signaling. Therefore, there exists a need to mitigate effects of noise on the transmitter chip and leakage in capacitances and FETs.

SUMMARY

One embodiment includes method and apparatus sample voltage (uplevel and downlevel) at an output of a differential transmitter. A plurality of brief samples are taken of uplevel and downlevel values at predetermined times during a relatively slow repeating signal and averaged over multiple cycles of the relatively slow repeating signal. The differential transmitter has a first and second controllable impedance, embodied as a plurality of selectable pullups and a plurality of selectable pulldowns. Averaged uplevels and downlevels are compared against target uplevels and downlevels. Exemplary target uplevels and downlevels using ¾ of a supply voltage for uplevel, ¼ of the supply voltage for downlevel, and ½ VIO as a midpoint voltage are used for a concrete example, but any target uplevels and downlevels may be used.

Sampling over a plurality of cycles of the relatively slow repeating signal mitigates random noise that may cause nonoptimal numbers of pullups and pulldowns to be selected. In case of nonrandom noise, jitter may be added to slightly vary sampling times.

The averaged uplevel voltage or averaged downlevel voltage is input to a comparator, with the target uplevel or downlevel a second input to the comparator. Pullups or pulldowns are selected or deselected until a "best setting" can be determined such that the uplevel and downlevel are as close as possible to the target uplevel and downlevel given the number of pullups and pulldowns implemented in a design.

Various uses for the apparatus include matching transmitter impedance to a distal terminator, or matching impedance of a differential lane being driven. In an embodiment, transmitter equalization is implemented, and the apparatus can be set to sample output of the differential transmitter at a time when output amplitude of the differential transmitter needs to be higher than the "DC" target voltage levels. Such higher levels can be controlled using sampling, averaging, higher uplevel target voltage, lower downlevel target voltage, and pullup and pulldown selection needed to get a best setting for proper equalization, followed by deselecting to get proper impedance to match the terminator or the differential lane.

BRIEF DESCRIPTION OF THE SEVERAL VIEWS OF THE DRAWINGS

FIG. 2C show a circuit to "jitter" (move around slightly) sampling times used to sample voltages on an output of the differential transmitter to mitigate non-random noise when sampling and averaging the sample voltages.

FIG. 2D shows use of DAC (digital to analog converter) and comparator to provide digital values so that a previous and present voltage can be compared digitally.

FIG. 12 shows an alternate way of producing a relatively slow repeating signal to use as data during transmitter impedance adjust mode.

DETAILED DESCRIPTION

Embodiments presented in this disclosure provide methods and apparatus to properly adjust impedance of a differential transmitter. Modern high-speed signal transmission, for example from 40 gigabits/second and faster from a differential transmitter to receiver, require very accurate control of a differential transmitter's impedance.

A differential receiver on a separate chip may implement a terminator resistor. For example, if both the plus and minus phase wires of a differential lane are 50 ohms, a 100 ohm terminator resistor between the plus and minus phase wire would eliminate reflections impinging on the receiver. However, manufacturing tolerances, both in the phases of the differential lane and the terminator resistor, and temperature effects, aging, and the like make perfectly matched impedances impossible. A first manufacturer may produce a first chip having the differential transmitter, a second manufacturer may produce a second chip having the receiver, and a third manufacturer may produce a differential lane (differential transmission line) so that selecting (or "binning") of the second chip or the differential lane may not be possible.

In a first embodiment of the invention, differential transmitter impedance is matched closely to terminator resistance; in the example above, if the terminator at the receiver is 100 ohms, each phase (plus phase and minus phase) of the differential transmitter will be adjusted to be 50 ohms. Note that "to be" means as close as possible for a given number of PFET pullups and number of NFET pulldowns selected. PFETs and NFETs are used as first and second controllable impedances for explanation of pullups and pulldowns but any selectable device (e.g., bipolar transistors) could be substituted for PFETs and NFETs.

Figure 1:
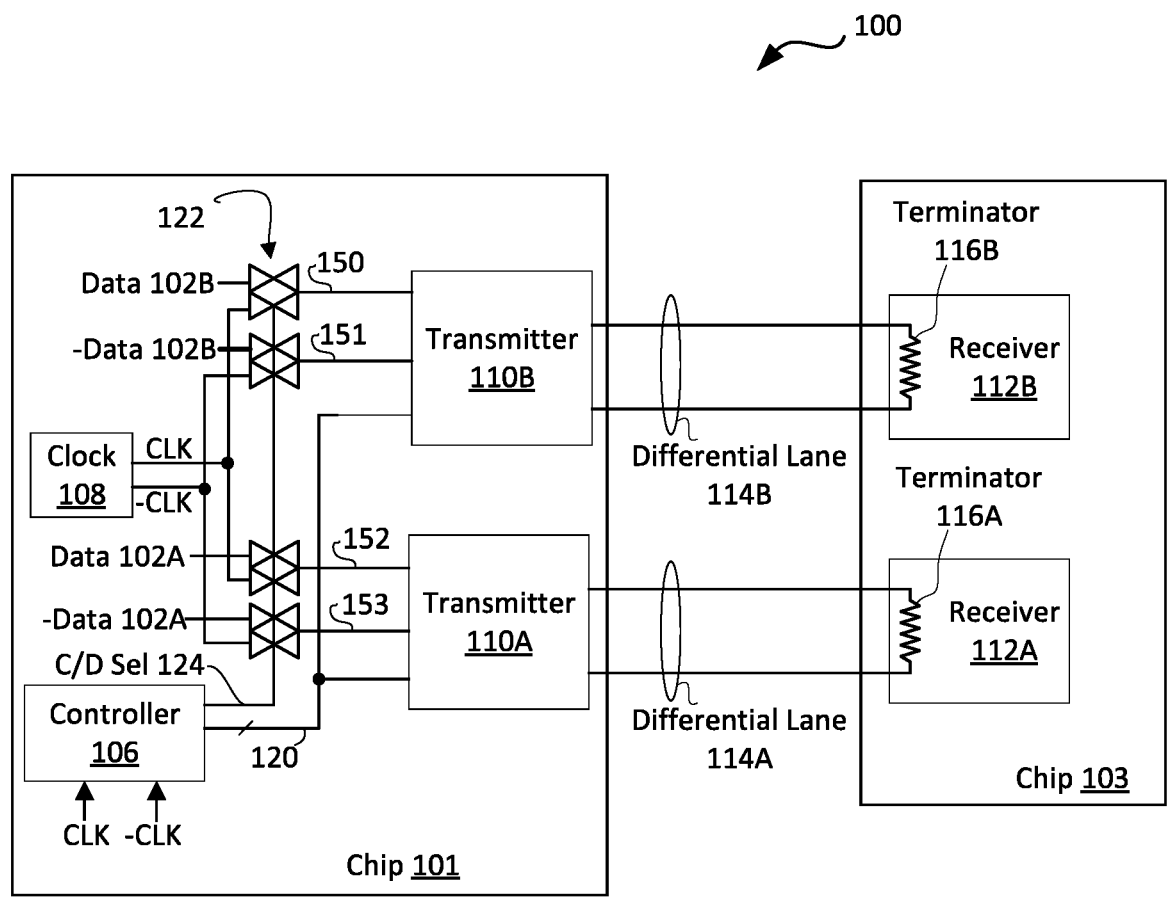
FIG. 1 is a schematic of a system having a differential transmitter on a first chip connecting to a receiver on a second chip, including circuitry to perform differential transmitter impedance adjustment according to embodiments of the invention.

Turning now to FIG. 1, system 100 is shown. System 100 comprises a first chip 101 and a second chip 103.

First chip 101 is shown to comprise two instances of differential transmitter 110, distinguished by reference numbers 110A and 110B. Any number of differential transmitters 110 from one instance to hundreds of instances are contemplated.

In figures, a letter following a reference number is used to identify a particular instance of an object. For example, differential transmitters 110A and 110B are instances of a differential transmitter 110.

Differential transmitter 110A receives a differential input, 152 and 153, and inputs 120 from a controller 106. Likewise, differential transmitter 110B receives a second differential input, 150 and 151, and input 120 from controller 106. Inputs 120 from controller 106 include signals to select PFETs and NFETs in differential transmitter 110. Under a C/D Sel 124 (Clock/Data Select) signal from controller 106, selectors 122 will select (Data 102B and −Data 102B) or (CLK and −CLK) for inputs (150 and 151) to differential transmitter 110B; and also (Data 102A and −Data 102A) or (CLK and −CLK) for inputs (152 and 153) to differential transmitter 110A. CLK and −CLK from Clock 108 are selected when differential transmitter impedance is being adjusted. Data (e.g., Data 102A and −Data 102A) are selected when differential transmitter 110 impedance is not being adjusted such as normal operation of system 100. In other words, a relatively slow repeating signal is transmitted when the differential transmitter impedance is being adjusted. Controller 106 also receives Clk and −Clk.

"Relatively slow repeating signal" is slow compared to normal high frequency clock rates. Exemplary frequency of the relatively slow repeating signal may be 5 nanoseconds up to 10 microseconds. Normal high frequency clock rates herein mean 10 gigahertz and higher.

Differential transmitters 110A and 110B then drive differential lanes 114A and 114B as shown to receivers 112A and 112B on chip 102. Receivers 112A and 112B have terminators 116A and 116B, respectively, as shown. Terminators 116A and 116B, respectively, are intended to match impedance of differential lanes 114A and 114B, respectively.

That is, as explained above, if each wire in a differential lane 114 is 50 ohms, the correct terminator value is 100 ohms.

Figure 2A:
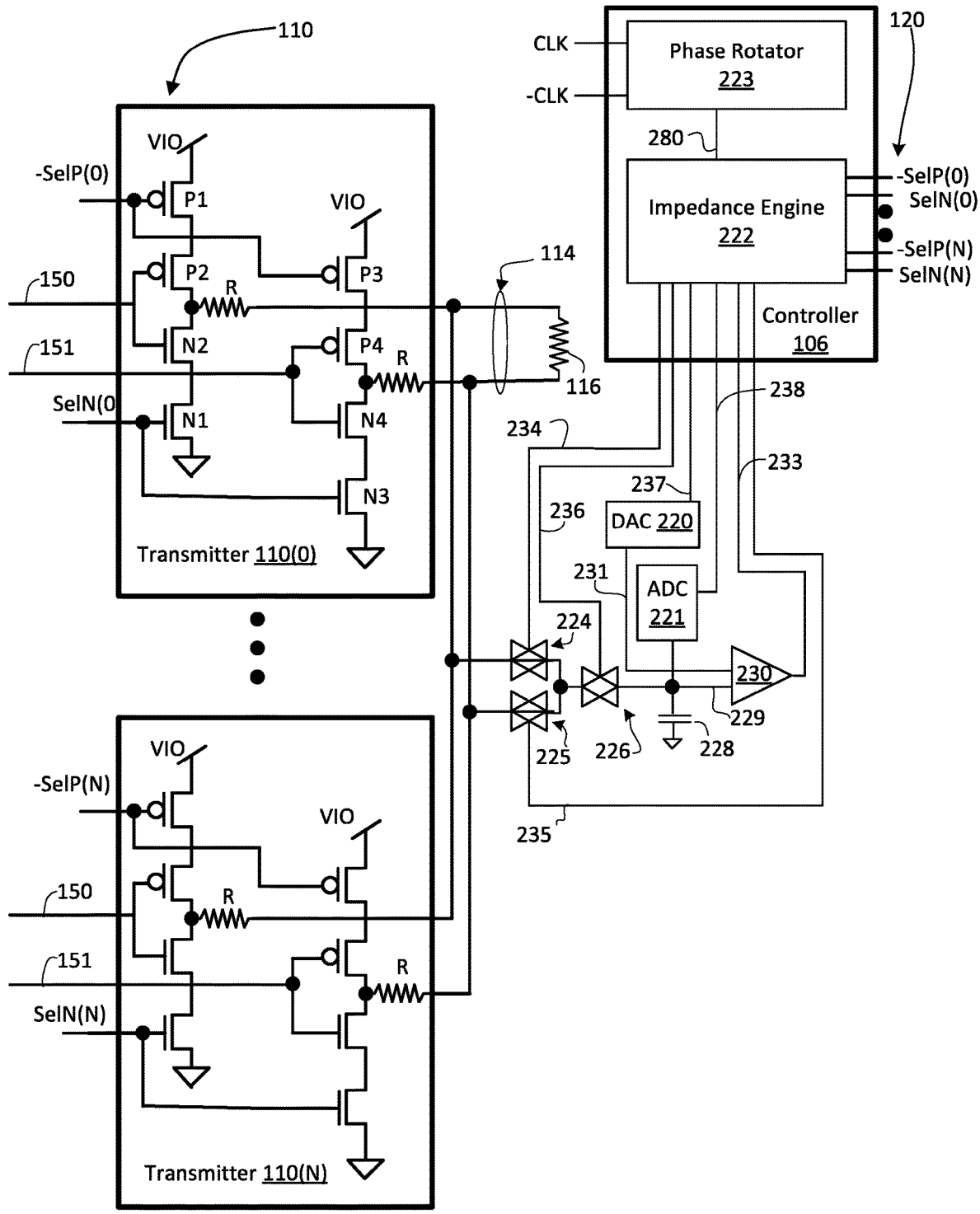
FIG. 2A is a more detailed schematic of a differential transmitter having a number of segments and a controller that controls impedance by controlling a number of PFETs (P channel Field Effect Transistors and a number of NFETs (N channel Field Effect Transistors) to enable for the desired differential transmitter impedance.
Figure 2B:
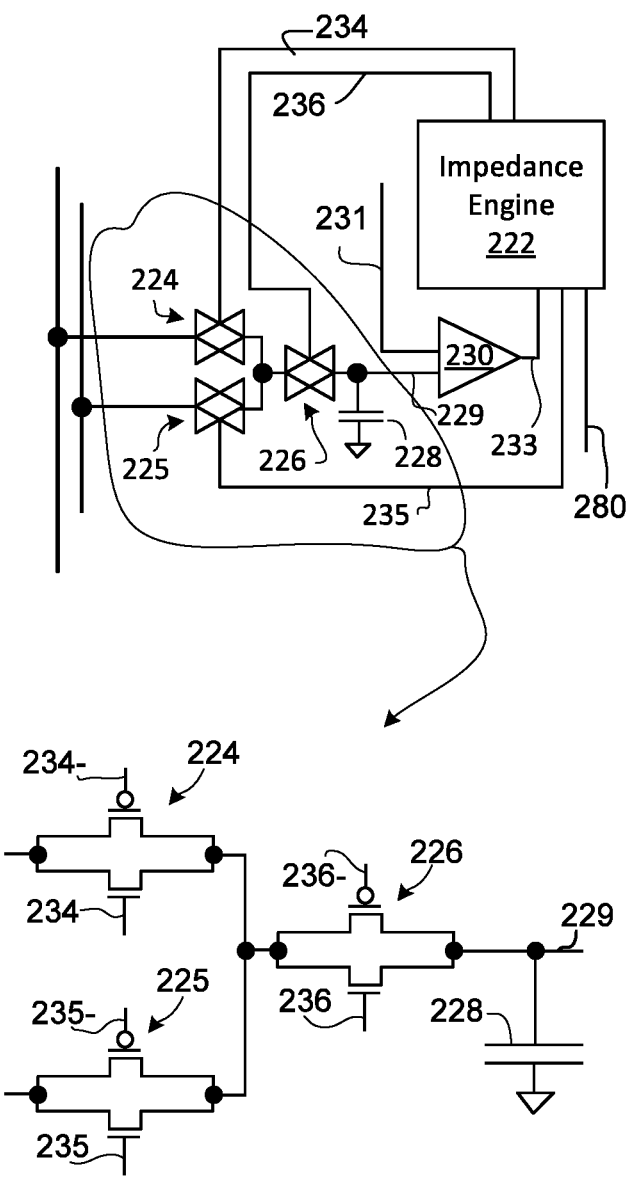
FIG. 2B shows a portion of FIG. 2A showing greater detail of analog selectors.

Turning now to FIGS. 2A and 2B, additional details of differential transmitter 110 is shown.

The apparatus shown in FIGS. 2A and 2B may be used in several ways. Described later with reference to FIGS. 4A and 4B, both plus and minus phases of differential transmitter 110 may be sampled, the sampling done at a timed delay after rise of a pulse from the relatively slow repeating signal (all uplevels sampled and averaged, then all downlevels sampled and averaged), or, only one phase may be sampled, and uplevels sampled and averaged at a first delay after rise of a pulse from the relatively slow repeating signal and downlevels sampled and averaged at a second delay after rise of the pulse from the relatively slow repeating signal.

Differential transmitter 110 comprises a number of segments, shown for exemplary purposes, as differential transmitter 110(0) through differential transmitter 110(N), for a differential transmitter 110 embodiment having N+1 segments. The number in parenthesis indicate which segment of differential transmitter 110 or, later, select signals to enable PFETs or NFETs in particular segments of differential transmitter 110.

Each differential transmitter segment has a selectable inverter for each phase (plus phase and minus phase) to be driven on differential lane 114. The plus phase for each differential transmitter segment is connected to each of the other differential transmitter segment plus phase as shown and the minus phase for each differential transmitter segment is connected to each of the other differential transmitter segment minus phase as shown. Note that each differential transmitter segment has a separate select for PFETs and NFETs so that the "pull up" on a particular differential transmitter segment can be actively driving but the "pull down" on the particular differential transmitter segment can be unselected. For example, −SelP(0), when active (low) turns on the PFETs P1 and P3 in differential transmitter 110(0), having sources connected to VIO (Voltage for Input/Output differential transmitters 110, which may be different from a VDD supply used to power chip internal logic) in differential transmitter 110(0). Likewise, SelN(0) turns on NFETs N1 and N3 in differential transmitter 110(0) that have sources connected to ground. The remaining PFETs (P2 and P4) and NFETs (N2 and N4) invert and drive signals from inputs 150 and 151 onto differential lane 114 when the PFETs and NFETs are selected as explained above. Resistors R are typically designed to provide most of the impedance in an output of each phase of each segment. Resistors have a smaller tolerance in impedance than FETs. Ideally, all output impedance would come from resistors R. Of course, FETs are never perfect "switches" so some portion of output impedance comes from the FETs. Resistors R also serve to provide more robust ESD (Electrostatic Discharge) protection. In examples here, all R values are assumed to be the same, however that is not a requirement and some resistors may be designed to have higher resistance than others, for example to allow fewer segments in differential transmitter 110, while still allowing "fine tuning" of output impedance of differential transmitter 110. Adding a high value resistor in parallel with a lower value resistor does not change the output impedance of differential as much as a low value resistor.

Suppose that an output impedance of each phase of differential transmitter 110 is to be 50 ohms to match a 100 ohm terminator 116. Further suppose that there are 16 segments in differential transmitter 110. Then (assuming that each segment is identical), each differential transmitter segment phase should have an output impedance of 50*16 ohms, or 800 ohms. In the real world, tolerances, temperature coefficient of resistance, and aging must be accommodated. For example, terminator 116 may have a 10% tolerance (including temperature, aging, and manufacturing tolerance. This means that, to match impedance of terminator 116, each phase of differential transmitter 110 must be able to provide an output impedance of 50+/−5 ohms. This means that, if each segment is designed to have 800 ohms on each phase, additional segments need to be added to match the 45 ohms per phase. If two more stages are added and selected, output impedance for each phase of differential transmitter 110 would be 44.44 ohms, closely matching the desired 45 ohms per phase. If only one more stage is added and selected, output impedance for differential transmitter 110 would be 47.06 ohms. Selecting two additional stages (18 in the example) would be closer to 45 ohms per phase than selecting one additional stage (17 in the example).

The example in the preceding paragraph ignores the fact that the resistors R, the PFETs, and the NFETs in differential transmitter 110 also have tolerances, aging, and temperature effects and these factors must also be accommodated in a manner similar to accommodating tolerances in terminator 116, again by providing additional stages in differential transmitter 110 and selecting or deselecting segments in differential transmitter 110.

It is an assumption in the following exemplary discussion that differential transmitter 110 has close tracking NFET to NFET, PFET to PFET, and resistor to resistor (all resistors are shown as just "R" and have the same value which helps in resistor to resistor tracking). However, as mentioned earlier, it is not required that all resistors be designed to the same value. Therefore, uplevel voltages and downlevel voltages for the plus phase wire on differential lane 114 are the same as uplevel voltages and downlevel voltages for the minus phase wire on differential lane 114. This is a very practical assumption. Without this assumption every PFET pullup and NFET pulldown would have to be separately controlled, versus having one PFET select and one NFET select per differential transmitter 110 segment. And, if resistors did not track well, PFET pullups and NFET pulldowns would need separate series resistors R.

FIG. 2A shows more detail for controller 106. Discussion here is when C/D Sel 124 from controller 106 controls selectors 122 to pass CLK and −CLK to differential transmitter 110 (shown in FIG. 1). Transfer gates 224, 225 and 226 under control of signals 234, 235, and 236, driven by impedance engine 222, will take short "snapshots" of a first phase or a second phase of differential lane 114, adding (or removing) some charge from capacitor 228. Phase rotator 223 determines when samples are taken, e.g., "x" time after a start of cycle of the relatively slow repeating signal from clock 108 begins. Several examples of what "x" may be and why those examples may be important are shown and explained with reference to FIGS. 4A and 4B. Signal 280 carries the selected sampling time from phase rotator 223 to impedance engine 222. FIG. 2B shows a more detailed view of an embodiment of transfer gates 224, 225, and 226. It will be noted that signals 234, 235, and 236, in this embodiment each include two wires having opposite phases. For example, signal 234 includes −234 (minus phase −234 is connected to a PFET in transfer gate 224) and +234 (plus phase +234 is connected to an NFET in transfer gate 224). When selected to pass data in this embodiment, +234 is at a high level ("1") and minus signal −234 is at a low level("0"). Transfer gates 225 and 226 are designed similarly to transfer gate 224. During impedance adjustment, capacitor 228 acts to provide an average of a voltage on a phase at a particular brief ("brief" meaning sub nanosecond to several nanoseconds) time in each cycle of the relatively slow repeating signal. Reference number 229 is a node connected to transfer gate 226, an input to comparator 230 and, in embodiments using ADC 221 an input to ADC 221, and capacitor 228. Transfer gates 224, 225, and 226 are designed to be relatively high impedance so that an average voltage at the output of differential transmitter 110 is developed on capacitor 228 is developed over a plurality of samples so that a noise spike on a last sample is averaged in with other samples. Number of samples means two to hundreds of samples, each sample not changing voltage on capacitor 228 by more than a fraction of the difference between a currently sampled output voltage of differential transmitter 110 and a current voltage on capacitor 228. For example, a designer may choose that fraction to be 20%.

After the number of samples, comparator 230 compares the voltage on capacitor 228, which is an average voltage of the selected phase at the sampling time to a voltage on signal 231, driven by DAC (Digital to Analog Converter) 220 based on a digital input from impedance engine 222. DAC 220 can be any type of DAC, for example the well-known R-2R DAC. Impedance engine 222 uses signal 233 output by comparator 230 to determine if the compare of voltage on capacitor 228 is greater than or less than signal 231 from DAC 220. Impedance engine 222 "knows" how many NFETs and PFETs are active in differential transmitter 110 and can change the number of NFETs and PFETs that are active based on a method explained later. For now, suppose that the first phase is being driven too far upwards; impedance engine 222 may deselect one or more PFETs in differential transmitter 110. In an embodiment, an uplevel for each phase is ¾ VIO and a downlevel for each phase is ¼ VIO. Impedance engine 222 in this embodiment controls NFETs that are selected and PFETs that are selected to come as close to ¾ VIO and ¼ VIO as possible, given how many segments in differential transmitter 110 are implemented.

Some embodiments of the invention may include ADC (analog to digital converter) 221 so that impedance engine 222 can store a previous sampling with a current sampling to see how much voltage change has occurred as PFETs or NFETs are deselected and "best settings" (see FIGS. 11A and 11B) are determined.

With reference now to FIG. 2D, alternatively to get a digital value of the previous sampling, impedance engine 222 may control analog voltage 231 from DAC 220 using digital values on bus 237 and determine, within the precision granularity of bus 237 and DAC 220, what the digital voltage is. In FIG. 2D, reference number 256 shows a drop in uplevel voltage caused by disabling one or more PFETs, e.g., P1 and P3 in FIG. 2A. For example, if bus 237 has eight bits, DAC 220 can use very small increments on bus 237 (such as incrementing by adding one to the eight bits of bus 237) to change the voltage on 231 from DAC 220 until comparator 230 causes the value on signal 233 to change, i.e., voltage 231 from DAC 220 has passed voltage 229 because of the change in digital value sent to DAC 220. Reference 272 shows how impedance engine 222 can raise voltage out of DAC 220 by small increments shown by voltages 272 (e.g., incrementing an eight bit digital value on bus 237) until comparator 230 changes state to determine how close previous uplevel 258 was to ¾ VIO. Likewise, impedance engine 222 can lower voltage out of DAC 220 by small increments shown as 273. In example shown in FIG. 2D, the previous uplevel 258 was closer to ¾ VIO than current level 259.

Assuming a one volt VIO voltage and eight bits on bus 237, (1 volt/256) gives 0.0039 volts granularity per incremental digital signal sent on bus 237.

Figure 3:
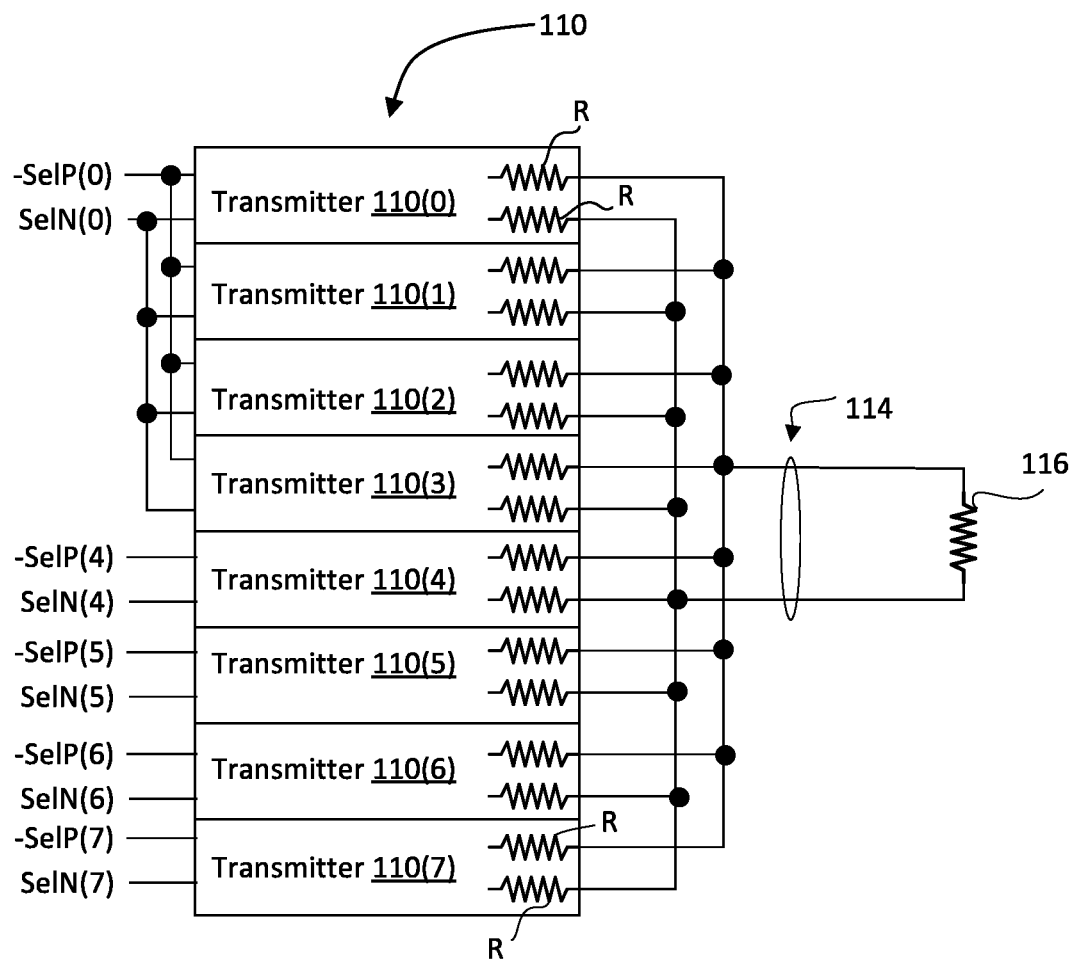
FIG. 3 shows one embodiment of a differential transmitter with a first group of segments controlled by a single pair of select signals, and a number of segments individually controlled by a unique pair of select signals for each segment.

With reference now to FIG. 3, an embodiment comprising eight segments is depicted. For simplicity, only resistors R are shown, although it will be understood that the FETs shown in the more detailed FIG. 2A also contribute to differential transmitter 110 impedance. Four segments are always selected, by −SelP(0) and SelN(0). In an embodiment, −SelP(0) is simply grounded and SelN(0) is simply connected to VIO. Differential transmitter segments 110(0) through 110(3) in this example provide a proper impedance under conditions (tolerances, temperatures, aging) when FETs are providing more current than at nominal conditions and the R resistors are at their low end of resistance. Some or all PFETs and NFETs in differential transmitter segments 110(4) through 110(7) are needed for conditions where differential transmitter segments 110(0) through 110(3) do not provide a low enough impedance. For example, if terminator 116 is nominally 100 ohms, but tolerance, temperature, and aging could make it 110 ohms, impedance of differential transmitter 110 at high current conditions should be 55 ohms for both plus and minus phases, that is, R+FET impedance should be 220 ohms. Four 220 ohm impedances in parallel=55 ohms. If terminator 116 is less than 110 ohms, then some or all PFETs and NFETs in differential transmitter segments 110(4) through 110(7) can be used to reduce output impedance of differential transmitter 110.

On the other hand, suppose that terminator 116 is at the other, low-resistance end of its conditions and is 45 ohms. Further suppose that conditions on differential transmitter 110 cause it to be "weak" (high resistance Rs, longer than nominal channel length FETs, high FET thresholds, and high temperature). Now, perhaps most or all of the PFETs and NFETs are needed for the "weak" differential transmitter 110 to match 45 ohm terminator 116. A designer may wish to include one or more spare differential transmitter segments to accommodate out of specification differential transmitter 110 or receiver 116 for a more robust implementation.

In the following discussion, reference to a point on a voltage waveform refer to voltage at the point on the voltage waveform. For example, 412 is "voltage at this reference point".

Figure 4A:
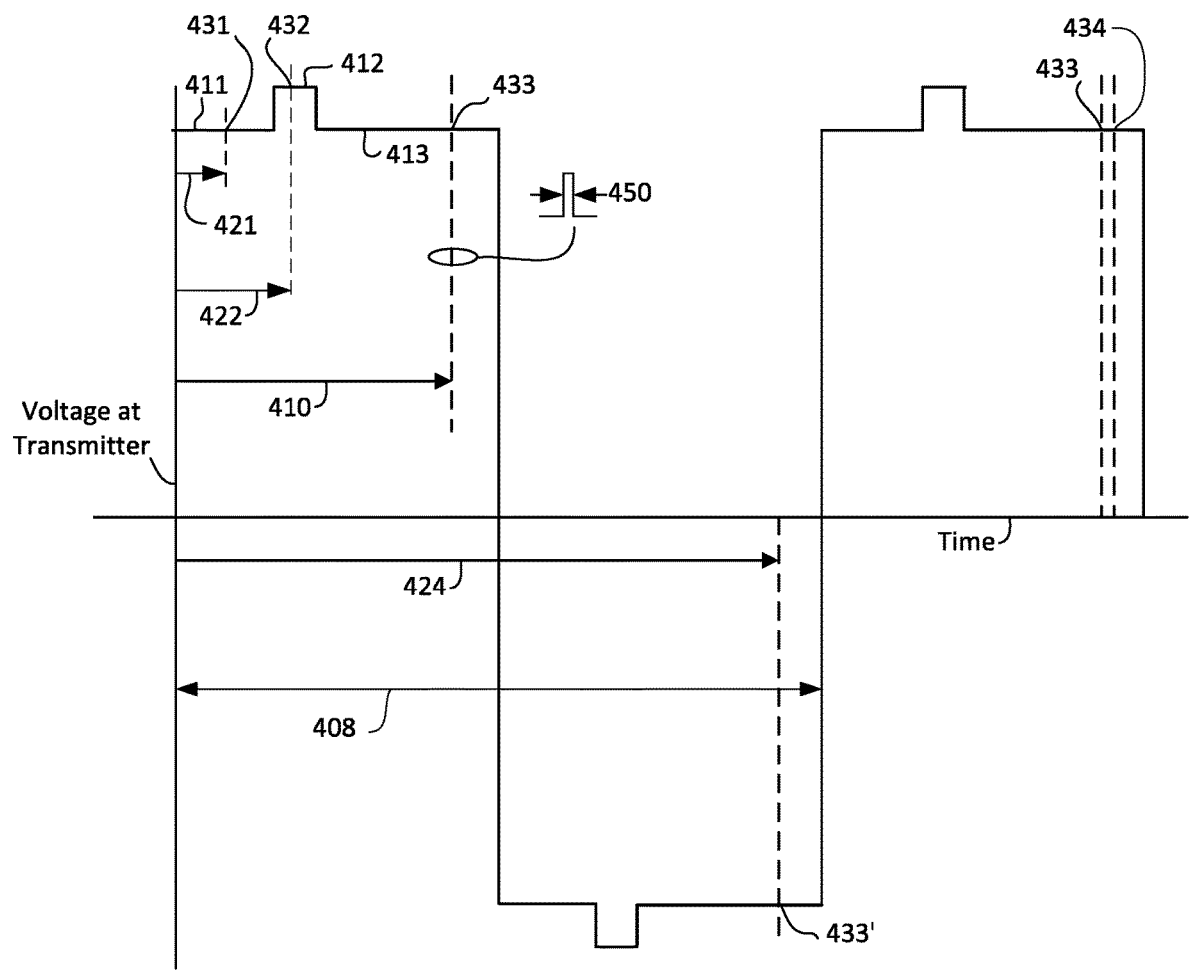
FIG. 4A shows one phase of a differential signal and where the uplevel signal is sampled at a first time from a beginning of a cycle and a downlevel signal is sampled at a second time from the beginning of the cycle; both uplevel and downlevels are sampled from the same phase of the differential signal.
Figure 4B:
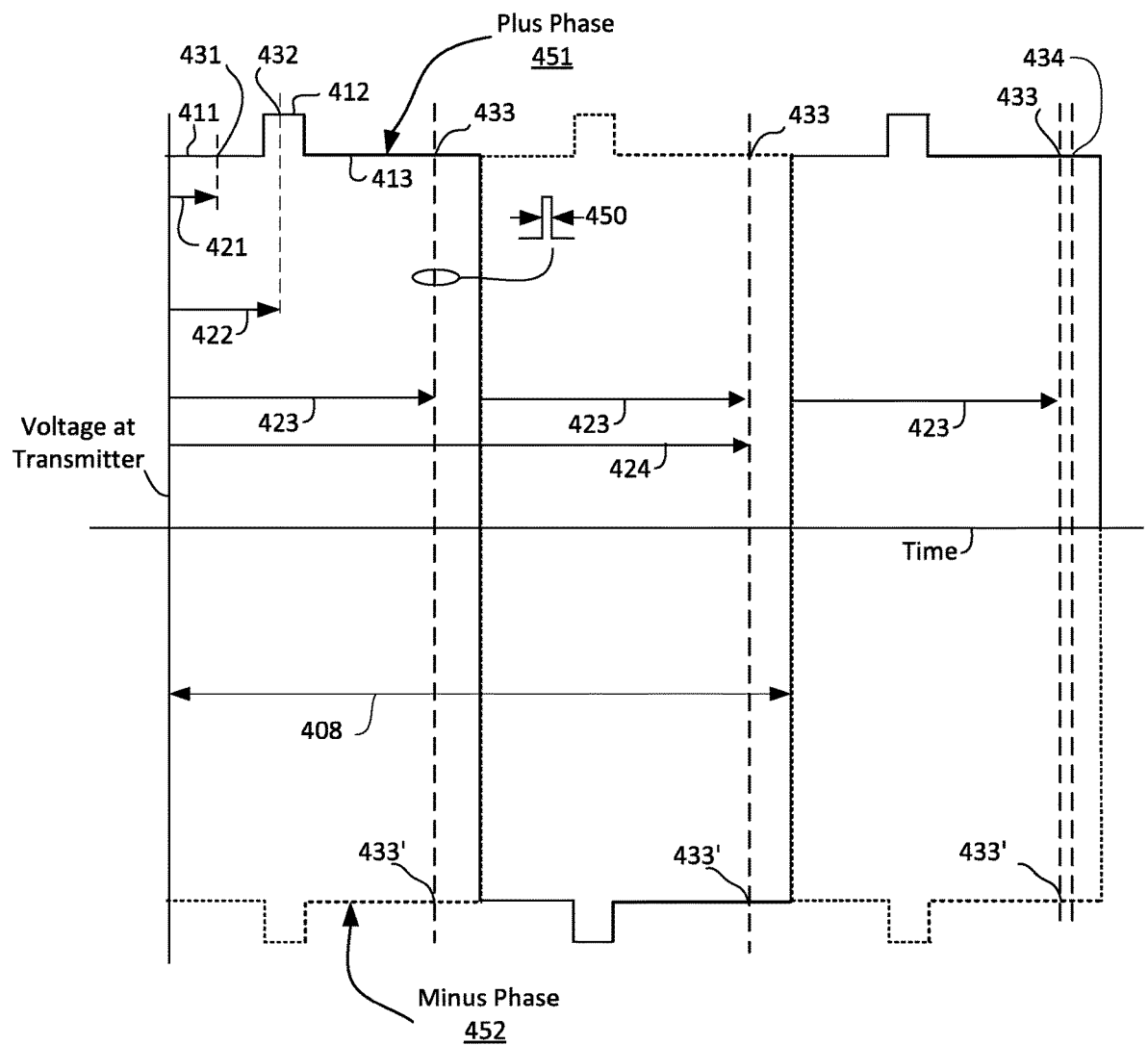
FIG. 4B shows how both phases of a differential signal are sampled at the same time after the beginning of the cycle; uplevel sampling is completed, and then the downlevel sampling is done.

FIGS. 4A and 4B show two slightly different embodiments of the invention shown in FIG. 2A, wherein the object of each embodiment is to match impedance of differential transmitter 110 impedance to resistance of terminator 116. In FIG. 4A, measurements are made using only a single phase driven onto differential lane 114 (plus phase shown), but samples taken at a first time for uplevels and a second time for downlevels. In FIG. 4B, measurements are taken at a first time for uplevels and at the first time for downlevels, but using measurements for uplevels and downlevels on different phases of differential lane 114.

With reference now to FIG. 4A, a plus phase waveform is shown during a differential transmitter 110 adjustment. A corresponding minus phase waveform would be just opposite, as will be understood by those of skill in the art, but all measurements are done using the plus phase. It will be understood that making measurements of only the minus phase is contemplated as well. Voltage 411 is voltage at the output of the differential transmitter 110 on the plus phase wire prior to arrival of a reflection and voltage 431 may be sampled at time 421 and averaged over a number of samples. Voltage 412 is a reflection that is soon damped by impedance of the differential transmitter 110. In a manner similar to sampling and averaging explained above, voltage 432 may be sampled at time 422. Voltage 413 is voltage at a time after reflections have gone away. At time 410 the voltage 433 is sampled onto capacitor 228 through the relatively high impedance transfer gates described earlier with reference to FIGS. 2A and 2B. Relatively high impedance transfer gates herein means that impedance of the transfer gates, duration of sample, and value of capacitance cause voltage on capacitor 229 to change no more than 20% per sample.

Reference 450 is a brief activation (e.g., from sub-nanosecond duration to several nanoseconds duration) of the appropriate transfer gate for the phase, e.g., making −235—a "0" and making +235 a "1", with −236—a "0" and +236 a "1" to forward the sample voltage onto capacitor 228. (Recall that signals 234, 235, and 236 include +234 and −234; +235 and −235; +236 and −236, respectively). Transfer gates 224 and 226 are not needed in the embodiment shown in FIG. 2A when sampling is done on only a single phase driven by transmitter 110 but are needed when both phases are to be sampled. In the example discussed earlier with differential transmitter 110 impedance to be matched to terminator 116 resistance, desired uplevel voltage 413 is ideally ¾ VIO. A plurality of samples are used, with transfer gates of high enough impedance to change voltage on capacitor 228 a small amount on each sample, suitable such that a good average of the differential output voltage being measured results. Those of skill in the art will recognize that the transfer gates could be a relatively low impedance in series with a relatively high value resistor (not shown) connected in series with the transfer gates. A plurality of samples (only two samples are shown) are taken with averaging of the plurality of samples averaged by capacitor 228. Then comparison of the voltage on capacitor 228 against the desired uplevel voltage provided on 231 by DAC 220 is done by comparator 230. While a number of samples used to sample uplevels may be the same as a number of samples used to sample downlevels, number of samples for uplevels and downlevels could be different. The output of comparator 230 is latched into impedance engine 222 shortly after the last sample at the last instance of sample 433 (for simplicity, shown as the second sample 433) at reference 434. This comparison is used by impedance engine 222 to determine if the uplevel output voltage of differential transmitter 110, for an uplevel being driven, is greater than or less than ¾ VIO in the present example.

Downlevel voltage of the plus phase wire of differential lane 114 is also shown in FIG. 4A, with a sample time indicated by reference number 424. Downlevel sampling voltage is indicated as 433'. As with uplevel sampling, a number of samples are used, each sampling will change voltage on capacitor 228 to provide an averaging process. At the end of the number of samples, the voltage on capacitor 228 is compared to the desired downlevel voltage (e.g., ¼ VIO) and comparator 230 reports if the downlevel voltage at differential transmitter 110 is greater than or less than ¼ VIO.

A full cycle length is shown by reference number 408.

During samples of the plus phase uplevel, samples of the downlevel on the second half cycle can not be performed with the apparatus shown in FIGS. 2A and 2B, with a single capacitor 228. It will be apparent to those of skill in the art that simple modifications, such as use of a separate capacitor and a separate transfer gate with obvious selector signals from impedance engine 222 would allow downlevels to be sampled in the same cycle as the uplevels.

It will also be apparent, given the relatively low frequency of the relatively slow repeating signal that ADC (Analog to Digital) sampling can be used instead of accumulating charge on capacitor 228 with digital computation used to average multiple samples.

Referring now to FIG. 4B, operation of the apparatus is similar to operation shown in FIG. 4A except that both phases of differential lane 114 are used, with sampling done at a same time from the start (rise of upgoing signal, e.g.) of a pulse driven by differential transmitter 110. Reference numbers that are the same as in FIG. 4A refer to the same times, waveforms, and voltages. In an embodiment having only one capacitor 228 as shown, both uplevel and downlevel cannot be sampled at the same time (reference 423 from the beginning of a pulse) and multiple samples are taken of uplevel voltages (433), the average value recorded in impedance engine 222 then downlevels (voltage sample of downlevels are again denoted as 433') are sampled multiple times, the value of the average recorded in impedance engine 222. Note however, using the described assumption of PFET/PFET, NFET/NFET, and resistor/resistor tracking, that an uplevel of plus phase 451 can be sampled at reference 423 from rise of plus phase 451 and that an uplevel of minus phase 452 can be also sampled as reference 423 from a rise of minus phase 452. Sampling of plus phase 451 on first half cycle and minus phase 452 on second half cycle is done by impedance engine alternating selections using signals 234 and 235. Reference number 424 shows time of sampling of minus phase 452 from rise of plus phase 451. This reduces by a factor of two the number of cycles of the clock needed to get an average value for uplevel, and, likewise, for getting a downlevel average. A second advantage in averaging uplevels (and downlevels) from both phases would be to average any very small differences in uplevel (or downlevel) between phases driven by differential transmitter 110 onto differential lane 114. Measuring both phases does require using both transfer gates 224 and 225 as well as transfer gate 226. In the case where uplevels (and downlevels) are used from both phases, selection of transfer gates 224 and 225 would be alternated and passed through transfer gate 226 to capacitor 228.

In another embodiment of the invention, clock 108 is not required to produce the slow repeating signal (such as clock 108 in FIG. 1). With reference to FIG. 12 chip 101, an embodiment of chip 101, includes a high frequency clock 1306 suitable for high speed transmission of data. High frequency clock 1306 has a frequency of ten GHz (gigahertz) or higher. High frequency clock 1306 drives FIFO data source 1302. FIFO (First In, First Out) data source 1302 may have one or more shift registers capable of very rapid shifting of data to differential transmitter 110 on lines 150 and 151 (both phases of a bit being shifted out simultaneously in the example). Signals 150 and 151 are the same lines as shown on FIG. 1, but selectors 122 and clock 108 are not needed in the embodiment being explained now, and 150, 151 are therefore the same as data 102 and −data 102 in FIG. 1.

FIG. 12 shows a UI (Unit Interval) 1304 that is very narrow, for example but not limiting, 20 ps (picoseconds). In transmitter impedance adjustment mode, FIFO data source 1302 sends a large number of "1"s (and "0"s on the minus phase) to transmitter 110, followed by a large number of "0"s (and "1"s on the plus phase). For example, if a full cycle (shown as reference number 408) is one thousand ns (nanoseconds), uplevel would be 500 ns and would require (500 ns)/0.02 ns/UI)=25,000 Unit Intervals for an uplevel. A downlevel would also require transmission of 25,000 Unit Intervals.

Samples can be taken at time 423 (and 424) starting from a first UI sent from FIFO data source 1302 to sample voltage 433 late in an uplevel (at time 423) and voltage 433' late in a downlevel (at time 424). Because of the very fine granularity of UI 1304, any point in the waveform can be sampled by having a number of "0"s inserted prior to a start of the large number of "1"s. Reference number 1308 shows that a number of "0"s shifts the waveform such that uplevel voltage sample 433 is sampled early in an uplevel and downlevel voltage 433' is sampled early in a downlevel while sampling times 423 and 424 are "fixed" relative to the first UI sent from FIFO data source 1302. This embodiment therefore also removes the need for phase rotator 223 as data, not sample time after first UI, is controlled.

Figure 5:
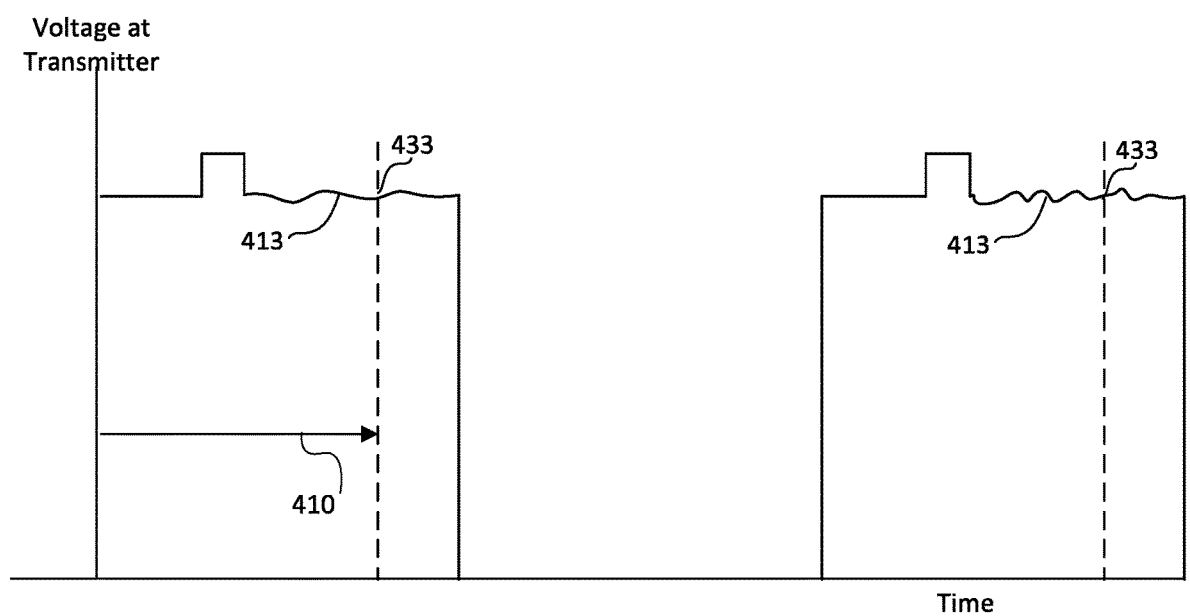
FIG. 5 shows one phase of a differential signal having noise on the signal (for simplicity, only a portion of the one phase of the differential signal uplevel is shown).

Turning now to FIG. 5, need for performing multiple samples and the apparatus to sample and average multiple cycles is explained. Again, for simplicity, only two uplevel half cycles are shown for explanation. Note that noise is shown on the uplevel voltage 413. Noise is a fact of life in digital (or analog) systems. Sampling is done at a time indicated by reference 410 and the voltage at that time is again indicated by reference number 433. Voltage 433 may have a noise component when sampled. On the next plus phase uplevel sample, again noise is shown on the uplevel voltage 413 and uplevel voltage 413 is sampled at a voltage indicated by reference number 433.

Nonrandom noise is contemplated. Random noise can be effectively mitigated in measurement by sampling at the same time (410) after a rising edge for uplevels (falling edge for downlevels) of the pulse and averaging the samples on capacitor 228. Repeating, nonrandom noise may occur regularly at a sample time 410 after a beginning of a plus phase uplevel sample. For this reason, the second sample 433 may be affected by the same noise as the first. An embodiment of phase rotator 223, described below with reference to FIG. 2C, describes an apparatus to provide a "jitter" to slightly vary sample time 410 to mitigate nonrandom noise effects on the measured uplevel (or downlevel).

Now that sampling times of differential transmitter 110 outputs have been explained, phase rotator 223 receives CLK and −CLK from clock 108 and moves sampling time, such as 410 or 424, in FIG. 4, a predetermined time after a beginning of a rising edge of a plus phase (in the example) of the relatively slow repeating signal cycle. As mentioned above, phase rotator 223 also may "jitter" sampling times to mitigate repeating noise events. Design of phase rotators is well known in the art, typically having a chain of inverters, with "rotation" (that is, fraction of a cycle 408, shown in FIG. 4) involving selection of a moving down the chain of inverters to provide a delay from a leading clock edge. A novel aspect of a phase rotator shown in detail in FIG. 2C is a phase rotator with "jitter", or varying slightly, the selected sample time 410 from a nominal selected phase. FIG. 2C provides an embodiment to do this.

With reference now to FIG. 2C, phase rotator 223 is shown in detail sufficient for understanding by those of skill in the art. Phase rotator 223 determines when a voltage is to be sampled. CLK in input to a chain of delay blocks 260. It will be understood that delays in the chain of delay blocks may be controllable, for example, by changing a supply voltage or by changing capacitance of capacitors driven by the delay blocks in the chain as is well known in the art to hold delay per delay block constant over temperature and process variations. Selector 261 selects an output, one of outputs 268 from chain of delay blocks 260, for output 280 (shown also in FIG. 2A) which is used by impedance engine 222 to sample voltage on a uplevel or downlevel at a particular time after rise of the CLK. Nominally selected delay register holds a predetermined time after rise of CLK and has "K" bits, where "K" specifies which delay block output to select, nominally. Pseudo random number generator 266 provides "P" bits (less than "K") to final delay generator 262. Final delay generator uses the "P" bits to replace "P" LSB (Least Significant Bits) of the "K" bits output by nominally selected delay register 264. Final delay generator 262 may be controlled to replace the LSB with the "P" bits from pseudo random number generator 266 or to not replace the LSB with the "P" bits from pseudorandom number generator 266. Also shown in FIG. 2C is a representative, well-known, embodiment of a pseudorandom number generator 266.

In an embodiment explained in reference to FIG. 12, FIFO data source 1302 can introduce some number of unit intervals of "0" or "1" to jitter the slow repeating waveform so that the sampling point would sample slightly different points on the waveform.

Figure 6:
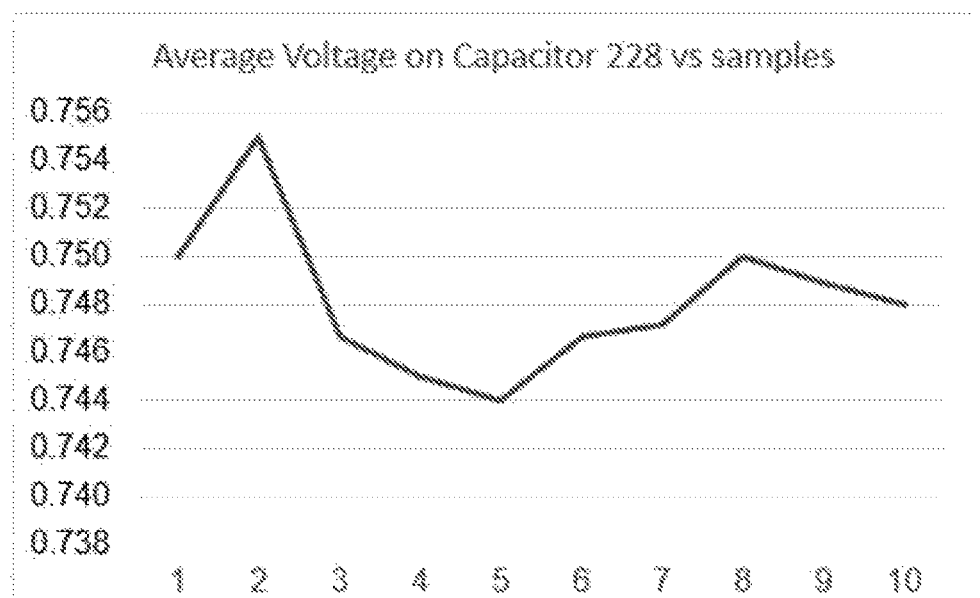
FIG. 6 shows exemplary samples of one phase of the differential signal and effects of averaging multiple samples.

FIG. 6 shows a graph and corresponding sample values of an uplevel voltage representative of a noisy system. The vertical axis is voltage on capacitor 228, referenced as node 229 in FIG. 2A. For simplicity only ten samples are shown, but fewer or more samples are contemplated. Note that with reasonably random noise the sampling and averaging is better (closer to an assumed perfect ¾ VIO) than most of the individual samples. As described above, repeated sampling and averaging of the plus phase downlevel and the plus phase uplevel and downlevel are performed and stored in impedance engine 222 which uses the information to determine the best selection of PFETs and NFETs in differential transmitter 110.

Figure 7:
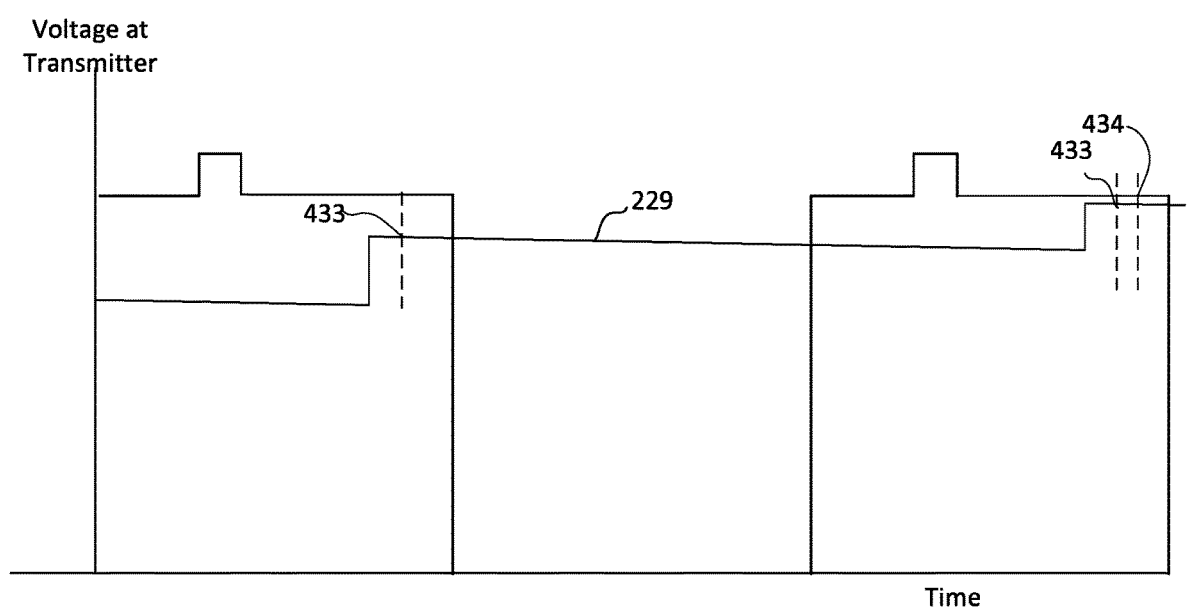
FIG. 7 shows one phase of a differential signal having leakage, e.g., from the PFETs and the NFETs and/or a capacitor (again, for simplicity, only a portion of the one phase for an uplevel is shown).

FIG. 7 again shows voltage on an uplevel of a plus (or minus) phase of differential lane 114. Voltage shown at reference number 433 on multiple cycles is sampled as described earlier. Reference number 229 shows voltage on capacitor 228. Note that over time, voltage 229 slowly decreases due to leakage. Also notice that voltage 229 increases as output voltage is passed from differential transmitter 110's output signal through a relatively high impedance to charge capacitor 228. The impedance, duration of sample, and capacitor value have to increase voltage 229 when sampling is done more than voltage 229 decreases due to leakage. After a number of cycles sufficient to bring voltage 229 to the selected differential transmitter 110 output voltage, voltage 229, impedance engine 222 latches in the value ("1" or "0") output of comparator 230 at time 434, shortly (for example, several nanoseconds, so that leakage on voltage 229 is not an issue) so that impedance engine knows if voltage 229 is less than or greater than DAC output 231.

In an alternative use for the apparatus to match differential transmitter 110 impedance to impedance of differential lane 114, and with reference to either FIG. 4A or FIG. 4B, output voltages can be repeatedly sampled very soon after differential transmitter 110 switches. Voltage uplevel and downlevel (shown best in dotted line 452 in FIG. 4B) shows a flat time for voltage 411 (uplevel) measured at 431 and time 421 in an embodiment where differential transmitter 110 impedance is to be matched to characteristic impedance of differential lane 114. The voltage level is determined by impedance difference between differential transmitter 110 and characteristic impedance of differential lane 114. Downlevels may be measured at the same time relative to beginning of the relatively slow repeating signal cycle by selecting the minus phase of differential transmitter 110 output, or, as explained earlier, at the same time relative to fall of the plus phase of differential transmitter 110 output. Measurement of an average value of voltage 431 can be obtained using the same apparatus and methods used to match terminator 116 described above, with the impedance engine adjusting number of PFETs and NFETs until the differential transmitter 110 impedance is the same as the transmission line impedance of differential lane 114.

Figure 8:
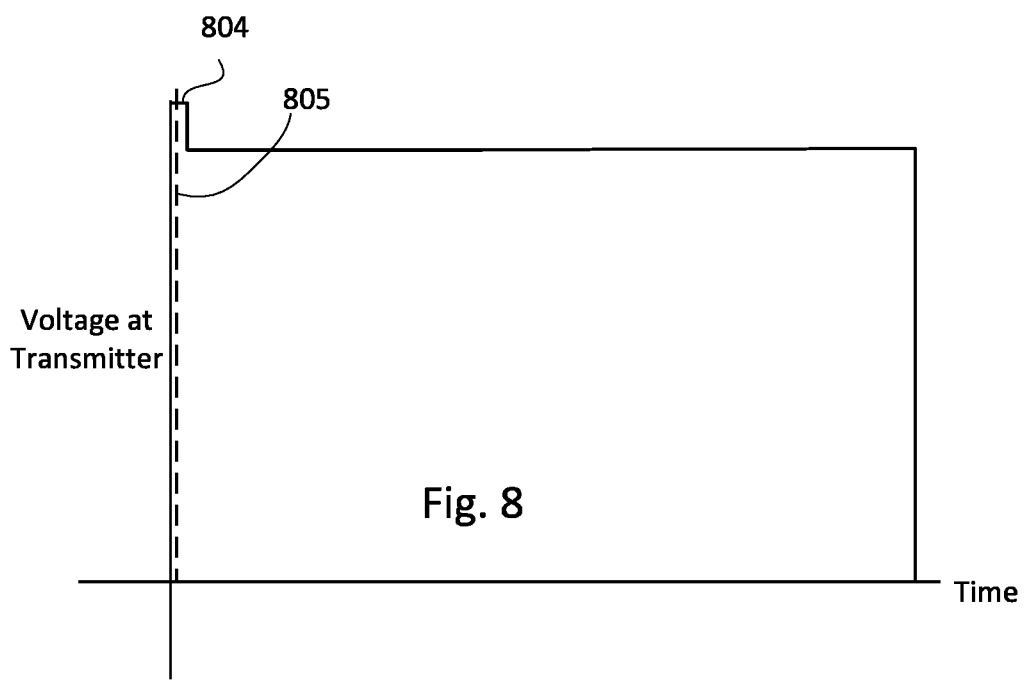
FIG. 8 shows one phase of a differential signal sampled during a brief elevated voltage used in differential transmitter equalization, such as is used in transmitters driving relatively long transmission lines (again, for simplicity, only a portion of the one phase uplevel is shown).

FIG. 8 shows another application for embodiments of the invention. In very high-speed data transfer over significant distances, transmitter equalization is performed to account for attenuation of high frequency components of a driven signal. Transmitter equalization has been known for many decades. Simply put, a differential lane (transmission line) has a transfer function of H(s), which characterizes loss of high frequencies. To account for this known attenuation of high frequencies, a transmitter may be designed to output a signal with a transfer function of 1/(H(s)). Transmitters do this using a form of digital filter, with uplevels driven higher than a "DC level" for a period of time to add high frequency strength to a beginning of a pulse. A user may want to use the present invention's apparatus to enable a first number of extra PFETs and a second number of extra NFETs for a short period of time to get a desired amplitude for the short period of time to conform to the equalization specification of the digital filter 1/H(s) equalization.

NFETs for a short period of time to get a desired amplitude for the short period of time to conform to the equalization specification of the digital filter 1/H(s) equalization.

FIG. 8 shows 804 as an uplevel voltage driven by differential transmitter 110, measured at time 805, very soon after a rising pulse on differential lane 114. Controller 106 samples the uplevel voltage (or downlevel voltage) very shortly after transition of the signal, as the briefly elevated signal may last only nanoseconds, or even fractions of a nanosecond. Averaging of a number of uplevel samples (or downlevel samples) is performed on capacitor 228. Controller 106 provides DAC 220 with target uplevels (and downlevels) to compare with the voltage on capacitor 228. Continuing the example of a "DC uplevel" of ¾ VIO and a "DC downlevel" of ¼ VIO, if differential transmitter 110 employs equalization, then DAC 220 may input a target uplevel to DAC 230 of ¹³⁄₁₆ VIO and a target downlevel to DAC 230 of ³⁄₁₆ VIO. Controller 106 would then select enough PFETs and NFETs, using −SelP and SelN signals to provide these uplevels and downlevels. Enough PFETs and NFETs, of course, must be provided in differential transmitter 110 to support these levels. Controller 106 would also turn off the PFETs and NFETs needed for equalization at a predetermined, preferably programmable, time after beginning of pulses of the relatively slow repeating signal from clock 108. Some equalization implementations employ more than a single "elevated" pulse at different voltage levels, e.g., a first "high" elevated pulse followed by a second "slightly high" pulse. Sampling and averaging multiple elevated pulses using the apparatus shown is contemplated.

Figure 9:
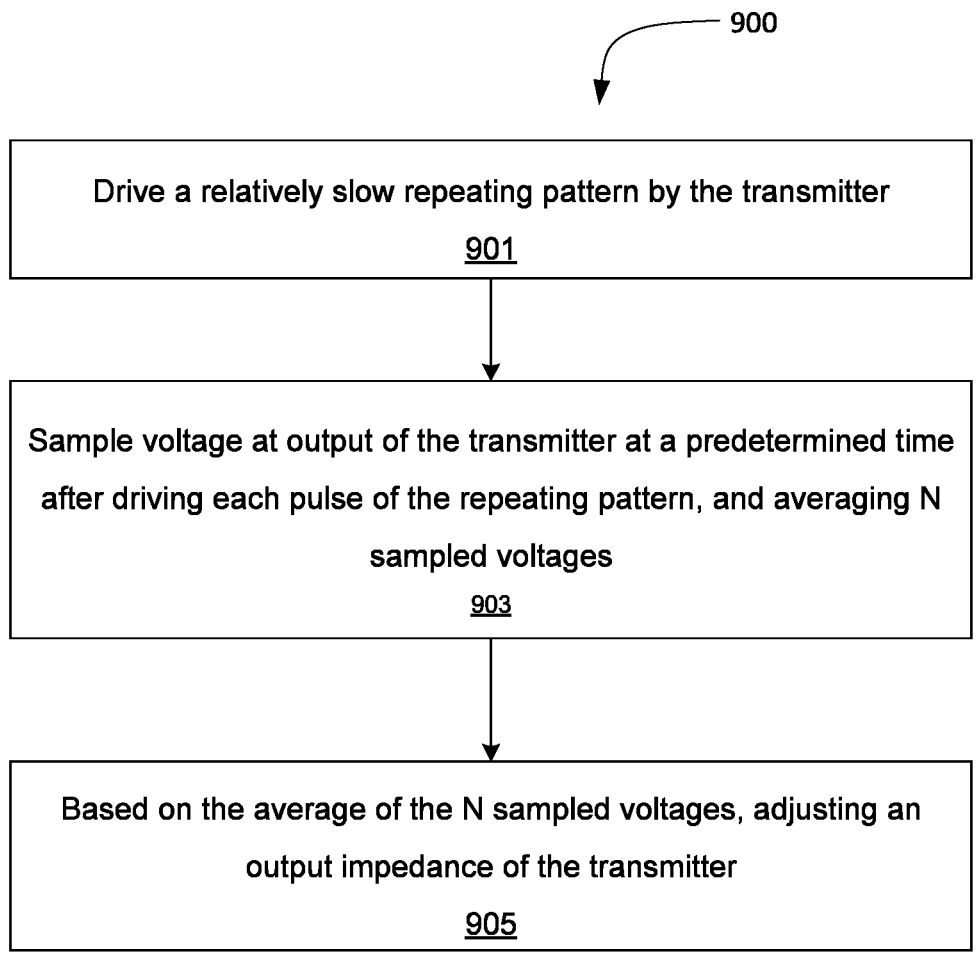
FIG. 9 shows a high-level flow chart the controller may perform in adjusting a number of PFETs and NFETs enabled for proper differential transmitter impedance.

With reference now to FIG. 9, method 900 is shown, providing a high-level flowchart of a method embodiment of the invention.

Method 900 begins at step 901. The relatively slow (e.g., hundreds to thousands of nanoseconds) repeating signal is driven as input to a differential transmitter (exemplary differential transmitter 110 shown in FIGS. 1 and 2) or is produced by a number of "1"s followed by a number of "0"s by a high frequency system clock in an embodiment shown in FIG. 12, the differential transmitter driving a differential lane (such as differential lane 114). Frequency of the relatively slow repeating clock signal is chosen to be long enough such that intersymbol interference (effects of a first pulse interfering with voltage on a subsequent second pulse) does not affect a pulse being currently measured. As explained earlier, "relatively slow repeating clock" has a cycle time from five nanoseconds to 10 microseconds.

In step 903, voltage at the output of the differential transmitter is sampled on "N" pulses driven and the "N" samples are averaged to minimize effects of noise.

In step 905, based on the average of the N sampled voltages, an output impedance of the differential transmitter is adjusted.

Figure 10:
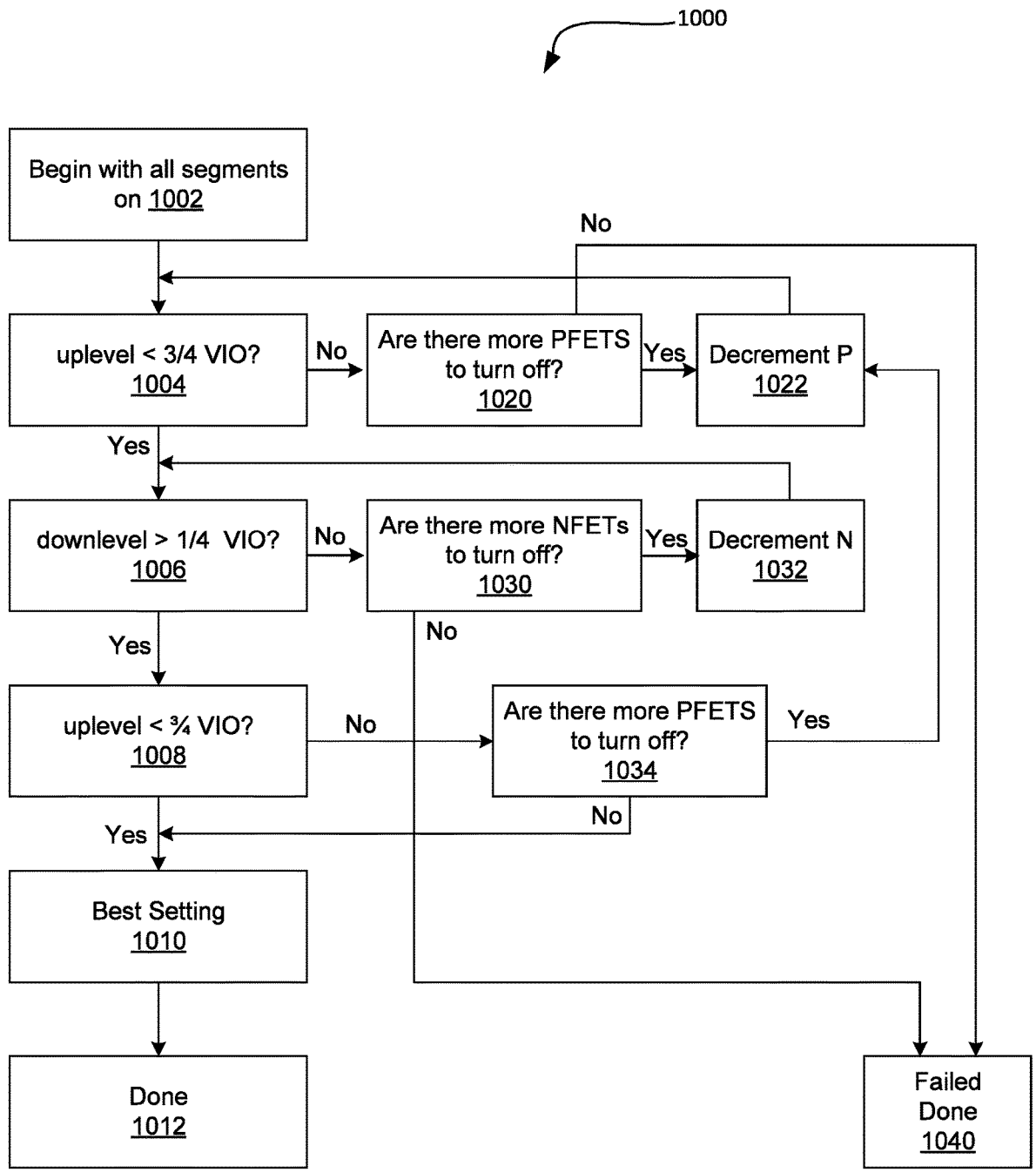
FIG. 10 shows a more detailed flow chart the controller may perform to match impedance of the differential transmitter to a terminator at the receiver.
Figure 11A:
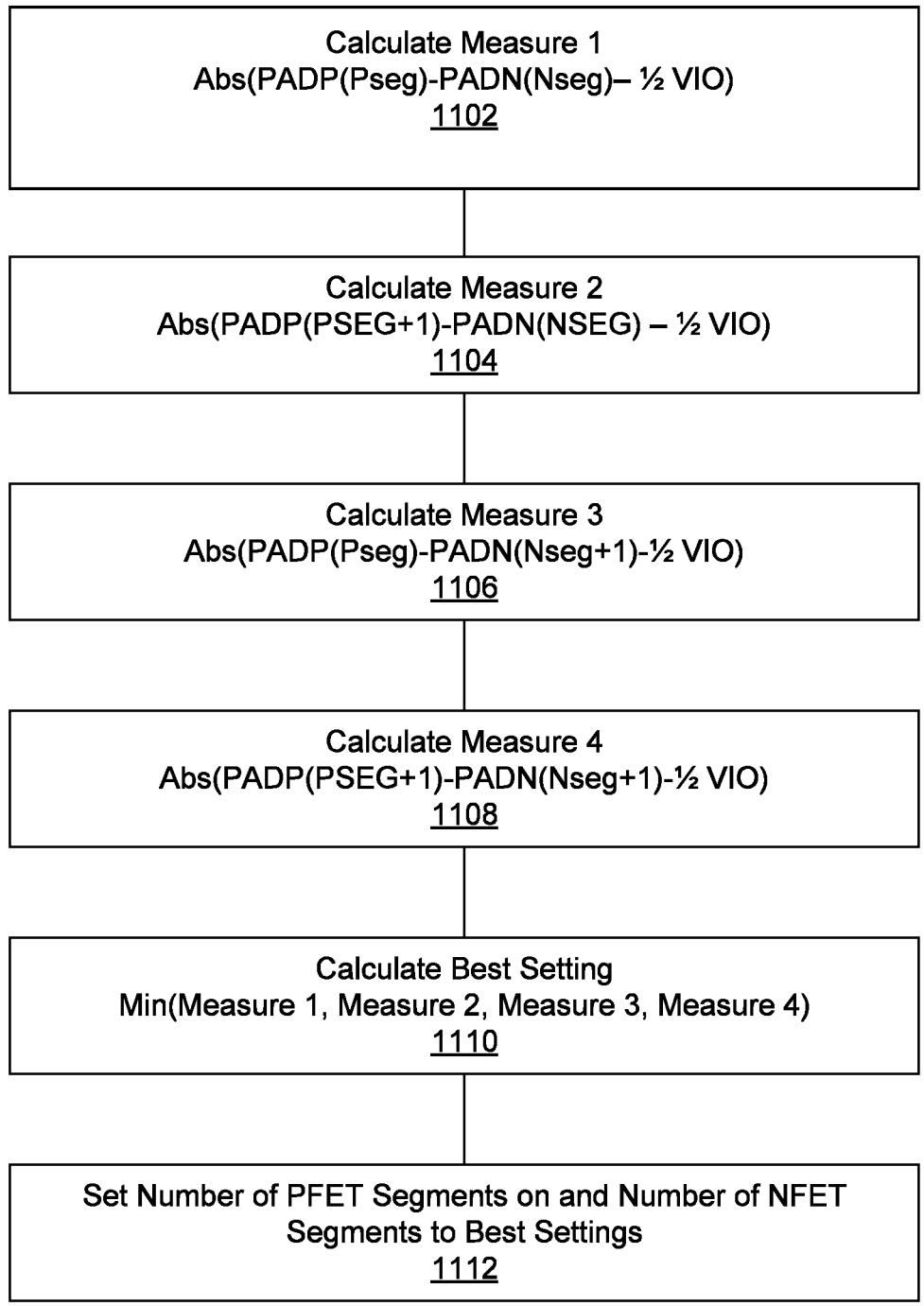
FIGS. 11A and 11B show more detail for a step in FIG. 10 to determine "best settings" in FIG. 10.
Figure 11B:
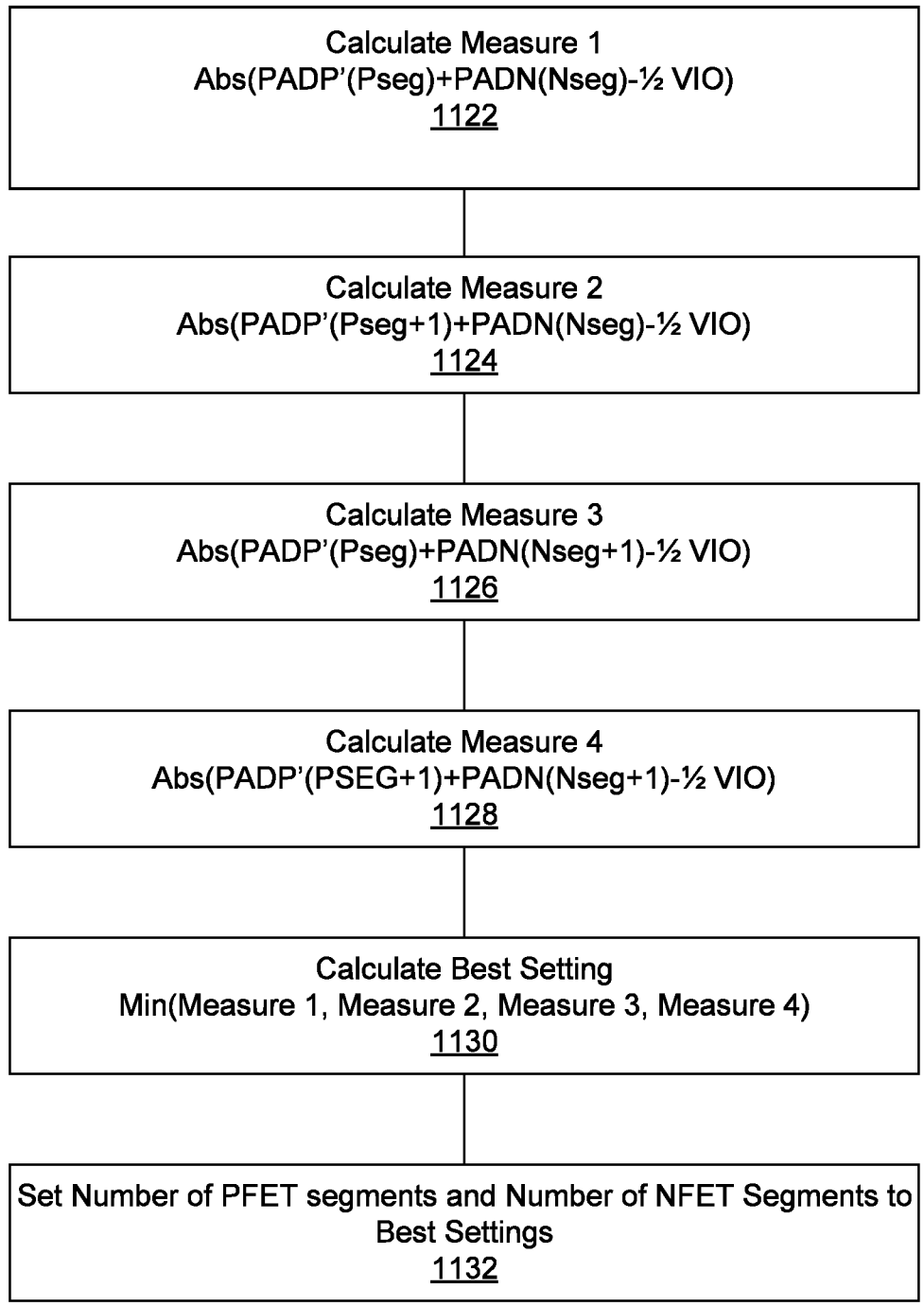

With reference to FIGS. 10, 11A, and 11B, steps performed to determine best settings (that is, number of PFETs selected and number of NFETs selected) are shown. "uplevel" is the averaged uplevel voltage explained earlier; "downlevel" is the averaged downlevel voltage explained earlier.

FIG. 10 shows a method 1000 used to match differential transmitter impedance to a terminator at a distal end of a differential lane. Sampling is done near the ends of uplevel and downlevel pulses on both phases of a differential signal driven on the differential lanes. To continue the example used earlier, an uplevel should be ¾ VIO, and a downlevel should be ¼ VIO for a particular terminator at the distal end of the differential lane. Apparatus used in method 1000 includes an ADC (analog to digital converter) such as ADC 221 in FIG. 2 so that, once a sampling is complete for a plus or minus phase uplevel or downlevel, the ADC digital value can be stored in impedance engine 222 to compare the previous voltage against the current voltage for that sampling. Alternatively, as explained an ADC function can be accomplished using a DAC, a comparator, and an impedance engine to vary a digital bus to the DAC.

In step 1002, all FETs (PFETs and NFETs) in all segments are on (selected).

In step 1004 sampling and averaging of an uplevel on a phase (plus or minus phase) of the signal is done as described earlier, averaging voltage measurements for a number of cycles of a relatively slow repeating signal. This averaged uplevel voltage is compared against ¾ VIO in step 1004. If averaged uplevel voltage is higher than ¾ VIO, too many PFETs are on, raising the uplevel above ¾ VIO. If uplevel voltage is greater than ¾ VIO, a check is made in step 1020 to see if more PFETs can be turned off; if so, one or more PFETs are turned off, referred to as "Decrement P". Then another sampling and averaging of uplevel voltage is done as step 1022 transfers control back to 1004. If there are no more PFETs to turn off, something is failing, such as a short circuit to VIO, and control passes from step 1020 to step 1040 which is a failure condition ending the method.

If, in step 1004, uplevel voltage is less than ¾ VIO, then sampling of a downlevel is performed, again as taught earlier. If averaged downlevel voltage is less than ¼ VIO, then too many NFETs are on and control passes to step 1030 which checks to see if there are more NFETs to be turned off. If not, control passes to step 1040 because a failure exists, such as a short circuit to ground. If additional NFETs can be turned off, then one or more are turned off ("Decrement N") in step 1032 and control passes back to step 1006 to see if the Decrement N brought the downlevel voltage up far enough. If downlevel voltage is greater than ¼ VIO, then control passes to step 1008 where another sampling and averaging of uplevel is done and a check is made to see if uplevel voltage is still less than ¾ VIO. If so, then control passes to step 1010 to pick a "best setting" using most recent downlevel and uplevel voltages or the immediately previous downlevel and uplevel voltages. If not, then control passes to step 1034 to see if there are additional PFET segments to turn off; if so, control passes to step 1022; if no, control passes to step 1010.

Impedance engine 222 keeps track of most recent and immediately previous values of downlevel and uplevel voltages using the digital voltage value provided by the ADC (or the DAC, comparator, and digital input supplied to the DAC by impedance engine 222 as explained above).

With reference now to FIGS. 11A and 11B, details of the "best setting" step shown in step 1010 of FIG. 10 are shown. FIG. 11A determines "best setting" using an "uplevel and downlevel" method. FIG. 11B determines "best setting" using a "supply voltage method". The two methods are equivalent, but use slightly different voltage measurement technique.

See FIG. 11A. The PFET segment settings (i.e., what PFET segments are selected are defined as Pseg). The NFET segment settings are defined as Nseg. Voltage (averaged voltage on Capacitor 228, using the technique explained earlier where digital values input to DAC 220 determine accurately voltage of an uplevel which will be called PADP or a downlevel which will be called PADN. PADP(Pseg) therefore is an averaged voltage measurement of an uplevel for a particular PFET segment setting. PADP(Pseg+1) is the averaged voltage measurement of an uplevel with one more PFET selected than PADP(Pseg). A similar naming convention is used for NFETs for downlevel averaged voltages.

In step 1102, measure 1 is calculated as ABS(PADP(Pseg)−PADN(Nseg)−½ VIO) which is with PFET and NFET selection configurations are the final PSEG and final NSEG when control is passed to block 1010 in FIG. 10.

In step 1104, measure 2 is calculated as the absolute value of (PADP(Pseg+1)−PADN(Nseg)−½ VIO). This measure is configured with the final Pseg with one more PFET segment selected, and with the final Nseg.

In step 1106, measure 3 is calculated as the absolute value of (PADP(Pseg)−PADN(Nseg+1)−½ VIO). This measure is configured with the final Pseg and with the final Nseg with one more NFET segment selected.

In step 1108, measure 4 is calculated as the absolute value of (PADP(Pseg+1)−PADN(Nseg+1)−½ VIO). This measure is configured with the final Pseg with one more PFET segment selected and with Nseg with one more NFEG segment selected.

In step 1110, best setting (for number of PFETs and number of NFETs) is calculated as minimum of (measure 1, measure 2, measure 3, measure 4).

In step 1112, Number of PFET segments and number of NFET segments are selected to the best setting determined in step 1110.

FIG. 11B shows a slightly different method than the method shown in FIG. 11A. The "best settings" (of PFET and NFET segments selected) are determined using voltage drop from the high supply voltage (VIO in the example) to the uplevel voltage, or (VIO−uplevel=PADP') and from the downlevel voltage to Gnd (0 volts), or downlevel voltage=PADN. Lower supply voltages greater than or less than Gnd (0 volts) are contemplated, but for simplicity, Gnd will be used for exemplary calculations. Uplevel and downlevel voltages as used here are again the averaged voltage of a number of samples of the uplevel and downlevel voltages.

As with FIG. 11A, the PFET settings are defined as Pseg and the NFET settings are defined as Nseg.

Accurate digital values for uplevel voltage and downlevel voltages are again determined by using an ADC converter or using the DAC and comparator to get a fine granularity digital value of voltage on Capacitor 228 (FIGS. 2A, 2B).

Step 1122: measure 1=Abs(PADP'(Pseg)+PADN (Nseg)−½ VIO). This measure is configured with the final PSEG and NSEG configuration when control is passed to block 1010 (FIG. 10).

Step 1124: measure 2=Abs(PADP'(Pseg+1)+PADN (Nseg)−½ VIO). This measure is configured with final Pseg setting but with one additional PFET segment selected and the final Nseg setting.

Step 1126: measure 3=Abs(PADP'(Pseg)+PADN(Nseg+ 1)−½ VIO). This measure is configured with the final Pseg setting and the final Nseg setting plus one additional NFET segment selected.

Step 1128: measure 4=Abs(PADP'(Pseg+1)+PADN (Nseg+1)−½ VIO). This measure is configured with the final Pseg and Nseg settings with one additional PFET segment and one additional NFET segment selected.

Step 1130: Calculate "best setting"=Min(measure 1, measure 2, measure 3, measure 4).

Step 1132 sets number of PFET sections and number of NFET sections according to the "best setting" determined in step 1130.

While the figures and explanation above give examples of ways to determine "best settings" starting from a configuration where all PFET and all NFET segments are enabled and decrementing until "¾ VIO" or "¼ VIO" are crossed, other techniques are contemplated, such as: binary searches; starting with only one (or a few) PFET sections and NFET sections off and adding (selecting) additional PFET and NFET sections, and the like are contemplated.

It will be understood that the particular embodiments shown in FIGS. 10, 11A, and 11B are exemplary embodiments that show initialization of all pullup and pulldown segments selected, then deselected until ¾ VIO and ¼ VIO are crossed, with ½ VIO being a midpoint, or "common mode" voltage. Pullup segments are deselected first until the averaged uplevel voltage passes ¾ VIO, the pulldown segments are deselected until the averaged downlevel voltage passes ¼ VIO. It will be understood that this method is only exemplary, and, for example, initialization may be set to have a limited number of pullup and pulldown segments selected, with additional segments added until the relevant target uplevels and downlevels are crossed. In embodiments, the midpoint voltage may be other than ½ VIO.

While the foregoing is directed to embodiments presented in this disclosure, other and further embodiments may be devised without departing from the basic scope of contemplated embodiments, and the scope thereof is determined by the claims that follow.

What is claimed is:

1. An apparatus comprising:
a source of a relatively slow repeating signal;
a differential transmitter having a first phase output and a second phase output, the differential transmitter further comprising:
a sampling circuit to:
sample an uplevel voltage on the first phase output at a first predetermined sample time in a cycle of the relatively slow repeating signal;
sample a downlevel voltage on the first phase output at a second predetermined sample time in the cycle of the relatively slow repeating signal; and
an averaging circuit to average a first plurality of samples of the uplevel voltage on the first phase output to produce an uplevel of the first phase and to average a second plurality of samples of the downlevel voltage on the first phase output to produce a downlevel of the first phase output; and
an impedance engine configured to adjust an output impedance of the differential transmitter using the average of the "N" samples of the uplevel voltage on the first phase output and the average of the "M" samples of the downlevel voltage on the first phase output, where "M" and "N" are each two or more.

2. The apparatus of claim 1, the predetermined time in the cycle of the relatively slow repeating signal is after reflection transients have disappeared.

3. The apparatus of claim 2, the impedance engine configured to adjust the output impedance of the differential transmitter to match a terminator at a distal end of a differential lane driven by the differential transmitter.

4. The apparatus of claim 1, the predetermined time in the cycle of the relatively slow repeating signal is before a reflection arrives at the first and second phase outputs, the impedance engine configured to match a transmission line impedance of a differential lane driven by the differential transmitter.

5. The apparatus of claim 1, the differential transmitter configured to provide equalization, and the predetermined time is during a higher amplitude portion of the equalization, the impedance engine adjusting impedance to cause the differential transmitter to conform to an equalization specification.

6. The apparatus of claim 1, the source of the relatively slow repeating signal being a clock separate from a high frequency clock used for functional operation.

7. The apparatus of claim 1, the source of the relatively slow repeating signal being a First In, First Out (FIFO) data source driven by a high frequency clock used for functional operation, and data provided by the FIFO data source comprising a plurality of "1"s being driven in a row followed by a plurality of "0"s being driven in a row.

8. The apparatus of claim 1, the averaging circuit comprising a selectable transmission gate and a capacitor, wherein impedance of the transmission gate, a length of time the selectable transmission gate is selected, and value of the capacitor ensure that voltage on the capacitor does not change more than 20% on a single sample.

9. The apparatus of claim 1 further comprising a DAC (digital to analog circuit) and a comparator, the impedance engine configured to drive a digital signal to the DAC, the comparator configured to compare an output of the DAC with the uplevel, the impedance engine latching in the value of the comparator after the "N"th sample of the uplevel.

10. The apparatus of claim 9, the DAC configured to compare an output of the DAC with the downlevel, the impedance engine latching in the value after the "M"th sample of the downlevel, and the impedance engine adjusting impedance and repeating the functions of claims 8 and 9 until an optimal setting of differential transmitter impedance is achieved.

11. The apparatus of claim 1, the relatively slow repeating signal is in the range of 5 nanoseconds to 10 microseconds per cycle.

12. The apparatus of claim 1, the sampling circuit further configured to:
sample an uplevel voltage on the second phase output at a third predetermined sample time in a cycle of the relatively slow repeating signal;

sample a downlevel voltage on the second phase output at a fourth sample predetermined time in the cycle of the relatively slow repeating signal; and the averaging circuit further configured to average "N" samples of the uplevel voltage on the second phase output to produce an uplevel of the second phase and to average "M" samples of the downlevel voltage on the second phase output to produce a downlevel of the second phase output.

13. The apparatus of claim 1 further comprising:

Circuitry to add jitter to the first and second predetermined sample times.

14. The apparatus of claim 13, wherein the predetermined first and second sample times are set by a phase rotator and the jitter is produced by a pseudo random number generator to modify the first and second sample times.

15. The apparatus of claim 13, wherein the jitter is produced by controlling a bit stream in a FIFO data source.

16. A method comprising the steps of:

driving a relatively slow repeating pattern by a differential transmitter;

sampling voltage an output of the differential transmitter at a predetermined sample time after driving each pulse of the relatively slow repeating pattern;

averaging "N" sampled voltages, "N" being at least five; and based on the average of the "N" sampled voltages, adjusting an output impedance of the differential transmitter.

17. A method for setting output impedance of a differential transmitter having a first controllable impedance to pull an output in a first direction and a second controllable impedance to pull in a second direction comprising the steps of:

initializing the first and second controllable impedances;

changing the first controllable impedance until a first final sampled and averaged output voltage crosses a first predetermined voltage at a final first controllable impedance setting;

changing the second controllable impedance until a second final sampled and averaged output voltage crosses a second predetermined voltage at a final second controllable impedance setting; and determining a best setting for the first and second controllable impedances;

setting the first and second controllable impedances to the best setting.

18. The method of claim 17, the determining a best setting for determining the best setting for the first and second controllable impedances comprises:

calculating measure 1: absolute value of the first final sampled and averaged output voltage minus the second final sampled and averaged output voltage minus a midpoint voltage;

calculating measure 2: absolute value of a penultimate first sampled and averaged output voltage minus the second final sampled and averaged output voltage minus the midpoint voltage);

calculating measure 3: absolute value of the final first sampled and averaged output voltage minus a penultimate second sampled and averaged output voltage minus the midpoint voltage;

calculating measure 4: absolute value of the penultimate first sampled and averaged output voltage minus the penultimate second sampled and averaged output voltage minus the midpoint voltage;

calculating best setting for first and second controllable impedances as the minimum of measure 1, measure 2, measure 3, and measure 4.

* * * * *